US012727234B2

(12) United States Patent
Lin et al.

(10) Patent No.: US 12,727,234 B2
(45) Date of Patent: Sep. 1, 2026

(54) FIN ISOLATION REGIONS WITH IMPROVED DEPTH DISTRIBUTION AND METHODS FORMING THE SAME

(71) Applicant: Taiwan Semiconductor Manufacturing Co., Ltd., Hsinchu (TW)

(72) Inventors: Tzu-Ging Lin, Kaohsiung City (TW); Yi-Chun Chen, Hsinchu (TW); Jih-Jse Lin, Sijhih City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 548 days.

(21) Appl. No.: 18/184,024

(22) Filed: Mar. 15, 2023

(65) Prior Publication Data

US 2024/0312843 A1 Sep. 19, 2024

(51) Int. Cl.
*H10D 84/03* (2025.01)
*H10D 84/01* (2025.01)
*H10D 84/83* (2025.01)

(52) U.S. Cl.
CPC ....... *H10D 84/038* (2025.01); *H10D 84/0151* (2025.01); *H10D 84/0158* (2025.01); *H10D 84/834* (2025.01)

(58) Field of Classification Search
CPC ........... H10D 84/0151; H10D 84/0188; H10D 84/0158; H10D 84/834; H10D 30/024; H10D 30/62
See application file for complete search history.

(56) References Cited

U.S. PATENT DOCUMENTS

| | | | |
|---|---|---|---|
| 5,242,539 A * | 9/1993 | Kumihashi | H01J 37/3244 257/E21.252 |
| 2013/0180951 A1* | 7/2013 | Indrakanti | H01L 21/027 216/41 |
| 2018/0108563 A1* | 4/2018 | Chen | H01L 21/76224 |
| 2019/0165137 A1* | 5/2019 | Chen | H10D 84/853 |
| 2020/0044070 A1* | 2/2020 | Wang | H10D 30/62 |
| 2021/0335670 A1* | 10/2021 | Ko | H10D 30/0243 |
| 2022/0415888 A1 | 12/2022 | Hsieh et al. | |
| 2023/0011474 A1 | 1/2023 | Yu et al. | |

FOREIGN PATENT DOCUMENTS

| | | |
|---|---|---|
| TW | 202303745 A | 1/2023 |
| TW | 202305953 A | 2/2023 |

* cited by examiner

*Primary Examiner* — Tuan A Hoang
(74) *Attorney, Agent, or Firm* — Slater Matsil, LLP

(57) ABSTRACT

A method includes forming a gate stack on a semiconductor region, wherein the semiconductor region is over a bulk semiconductor substrate. The gate stack is etched to form a first trench, wherein a plurality of protruding semiconductor fins are revealed to the first trench. The plurality of protruding semiconductor fins are etched to form a plurality of second trenches extending into the bulk semiconductor substrate. The plurality of second trenches are underlying and joined to the first trench. The plurality of second trenches include a first outmost trench having a first depth, a second outmost trench, and an inner trench between the first outmost trench and the second outmost trench. The inner trench has a second depth equal to or smaller than the first depth. A fin isolation region is formed to fill the first trench and the plurality of second trenches.

20 Claims, 30 Drawing Sheets

10
22
20
22T
25'
24'
24'
25
22
24
22
24
22
25
22
25'

10
72T
72M
72B
72
68
64
74
74
74
22T
22B
24'
46
38
50
48
42
52
54
56

10
22T
22B
24'
86B
86A
86
64
50
48
46
42
38
54
52
56
86B/84
86A
/84
24'
88

10
94
92
86B
86A
86
90
50
48
46
42
38
54
52
56
24'
22T
22B
100
86B
86A

FIN ISOLATION REGIONS WITH IMPROVED DEPTH DISTRIBUTION AND METHODS FORMING THE SAME

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically includes forming long semiconductor fins and long gate stacks, and then forming isolation regions to cut the long semiconductor fins and long gate stacks into shorter portions, which act as the fins and the gate stacks of FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
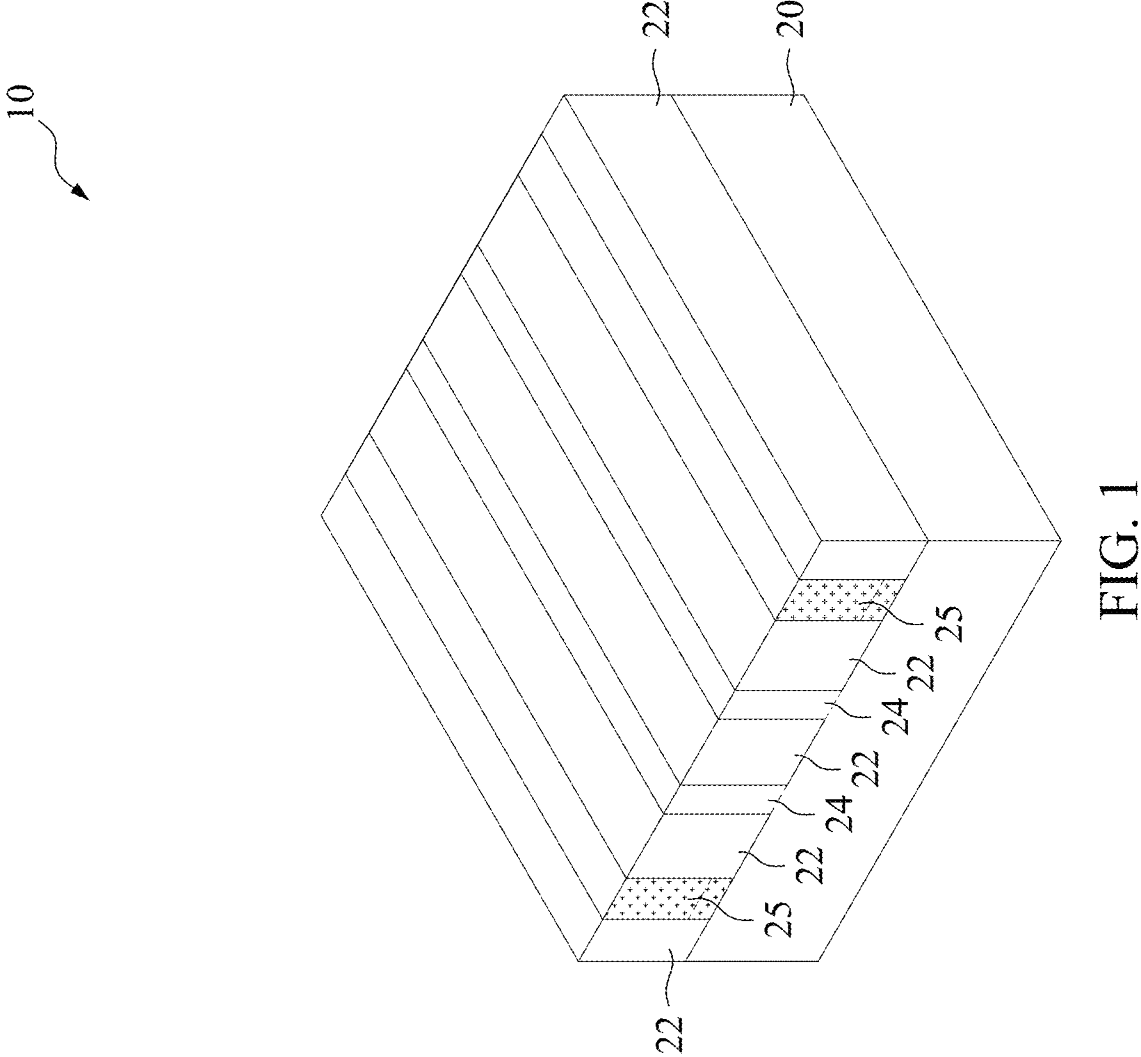
FIGS. 1-8, 9A, 9B, 10, 11A, 11B, 11C, 12A, 12B, 13A, 13B, 14A, 14B, 15A, 15B, 16A, 16B, and 16C illustrate the perspective views, cross-sectional views, and a top view of intermediate stages in the formation of isolation regions and Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming isolation regions for isolating transistors is provided. The profiles of the isolation structures are also provided. In accordance with some embodiment, a gate stack is etched to reveal the underlying protruding semiconductor fins. The semiconductor fins and the underlying bulk semiconductor substrate are etched so that the resulting recesses extend into the underlying bulk semiconductor substrate. In the etching process, the gas conductance is increased to adjust the profile of the resulting depths of the recesses. Sputtering effect may also be increased in the etching process to adjust the profile. It is appreciated that although the formation isolations for FinFETs is used as an example, the method may also be applied to the isolation of other transistors such as planar transistors, Gate-All-Around (GAA) transistors, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-8, 9A, 9B, 10, 11A, 11B, 11C, 12A, 12B, 13A, 13B, 14A, 14B, 15A, 15B. 16A, 16B, and 16C illustrate the perspective views, cross-sectional views, and a top view of intermediate stages in the formation of isolation regions and FinFETs in accordance with some embodiments. The corresponding processes are also reflected schematically in the process flow shown in FIG. 21.

Figure 21:
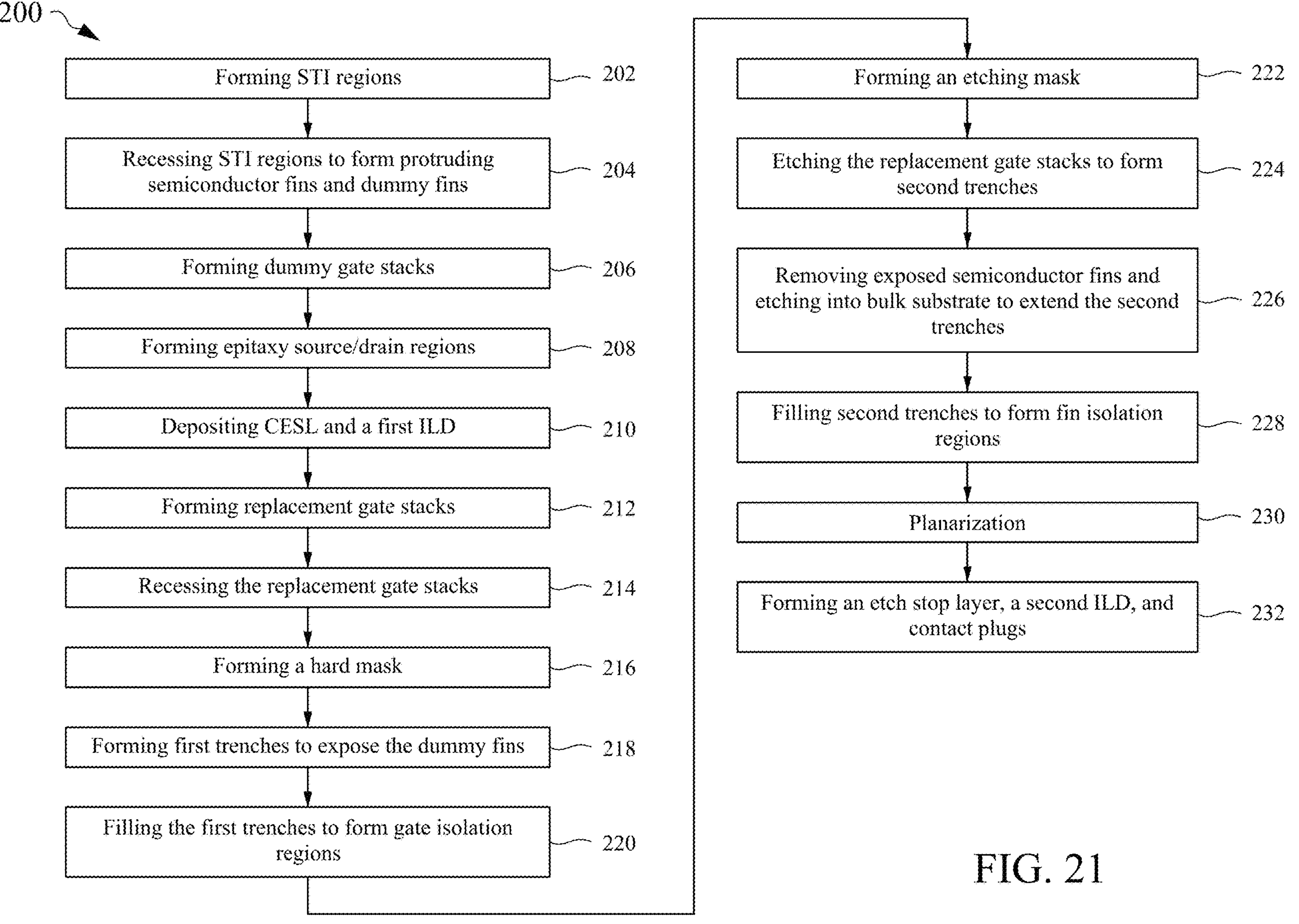
FIG. 21 illustrates a process flow for forming isolation regions and FinFETs in accordance with some embodiments.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 as shown in FIG. 21. The portions of substrate 20 between neighboring STI regions 22 are referred to as semiconductor strips 24.

In accordance with some embodiments, semiconductor strips 24 are parts of the original substrate 20, and the material of semiconductor strips 24 is the same as that of the underlying bulk portion of substrate 20. In accordance with alternative embodiments, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, carbon-doped silicon, SiPC, SiGe, SiGeB, Ge, a III-V compound semiconductor such as InP, GaAs, AlAs, InAs, InAlAs, InGaAs, or the like.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on coating, or the like.

FIG. 1 further illustrates the formation of dielectric dummy strips 25. In accordance with some embodiments, dielectric dummy strips 25 are formed by etching one of the semiconductor strips 24 to form recesses, and then filling the recesses with a dielectric material. Accordingly, the bottoms of dielectric dummy strips 25 are in contact with the top surfaces of the underlying bulk portion of semiconductor substrate 20. In accordance with other embodiments, dielectric dummy strips 25 and their surrounding portions of STI regions 22 are formed in a combined process. The resulting dielectric dummy strips 25 may land on the underlying dielectric material, and dashed lines are shown to represent the bottom surfaces of dielectric dummy strips 25. Dielectric dummy strips 25 may be formed of or comprise a high-k dielectric material such as silicon nitride.

Figure 2:
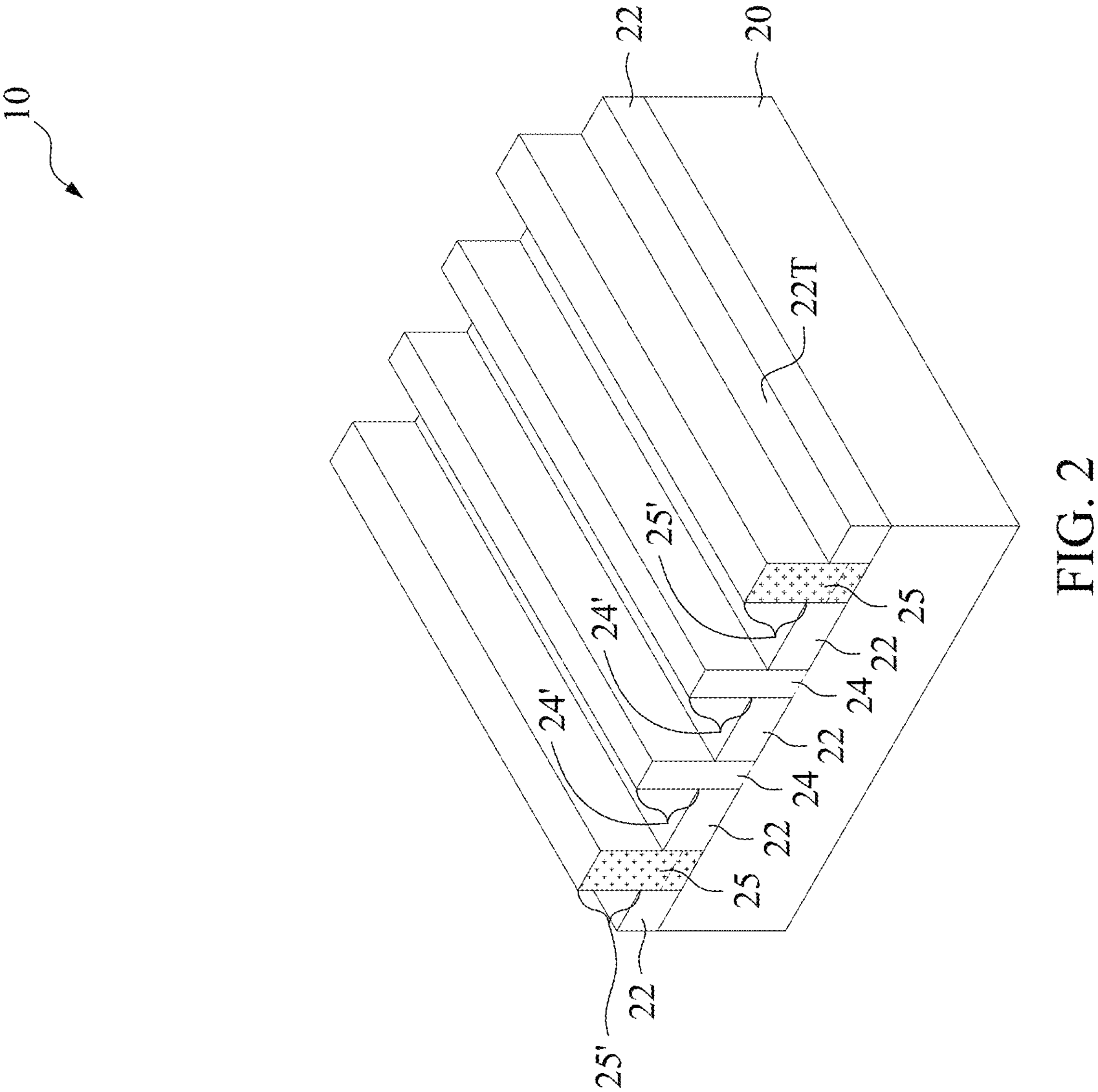

The semiconductor strips 24 between two dielectric dummy strips 25 collectively form a semiconductor strip group. The semiconductor strips 24 in the same semiconductor strip group may have a uniform pitch or a substantially uniform pitch (for example, with a variation smaller than about 20 percent). In accordance with some embodiments, as shown in FIG. 1, a semiconductor strip group may include two semiconductor strips 24 (and the corresponding semiconductor fins 24' as shown in FIG. 2). In accordance with alternative embodiments, the semiconductor strip group may be a single-strip group including a single semiconductor strip 24. In accordance with yet alternative embodiments, the semiconductor strip group may include a plurality (more than two) semiconductor strips 24. For example, FIG. 16C illustrates an example semiconductor strip group including a plurality of closely located semiconductor strips 24.

Referring to FIG. 2, STI regions 22 are recessed. The top portions of semiconductor strips 24 and dielectric dummy strips 25 protrude higher than the top surfaces 22T of the remaining portions of STI regions 22 to form protruding fins 24' and dummy fin 25', respectively. The respective process is illustrated as process 204 in the process flow 200 as shown in FIG. 21. The etching may be performed using a dry etching process, wherein etching gases such as the mixture of HF and $NH_3$ may be used. In accordance with alternative embodiments, the recessing of STI regions 22 is performed using a wet etching process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
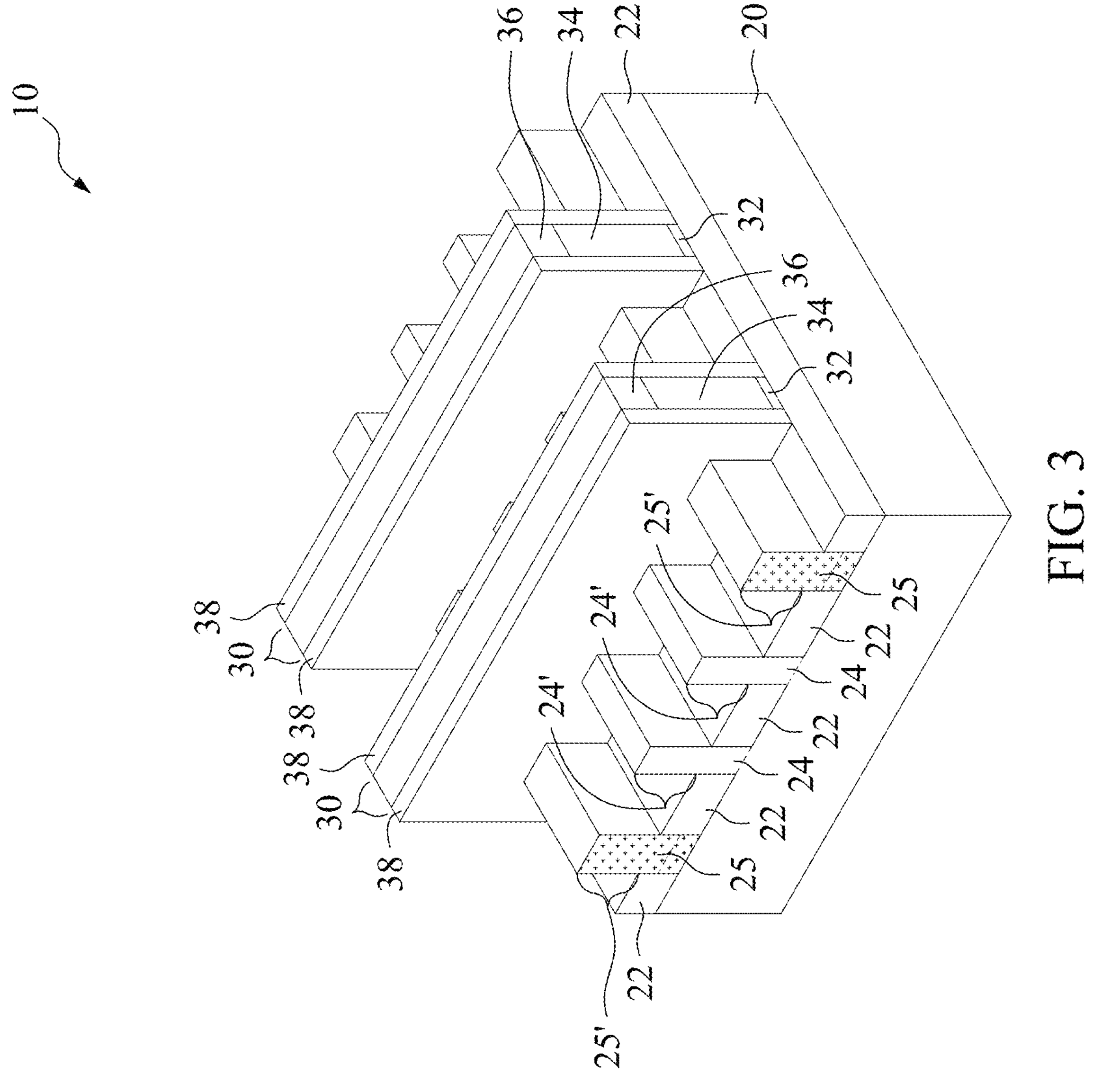

Referring to FIG. 3, dummy gate stacks 30 and gate spacers 38 are formed on the top surfaces and the sidewalls of (protruding) fins 24' and dummy fin 25'. The respective process is illustrated as process 206 in the process flow 200 as shown in FIG. 21. Dummy gate stacks 30 may include dummy gate dielectrics 32 and dummy gate electrodes 34 over dummy gate dielectrics 32. Dummy gate electrodes 34 may be formed, for example, using polysilicon or amorphous silicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and dummy fins 25' and STI regions 22. Dummy gate stacks 30 also have lengthwise directions perpendicular to the lengthwise directions of protruding fins 24' and dummy fin 25'.

Next, gate spacers 38 are formed on the sidewalls of dummy gate stacks 30. In accordance with some embodiments, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers.

Figure 4:
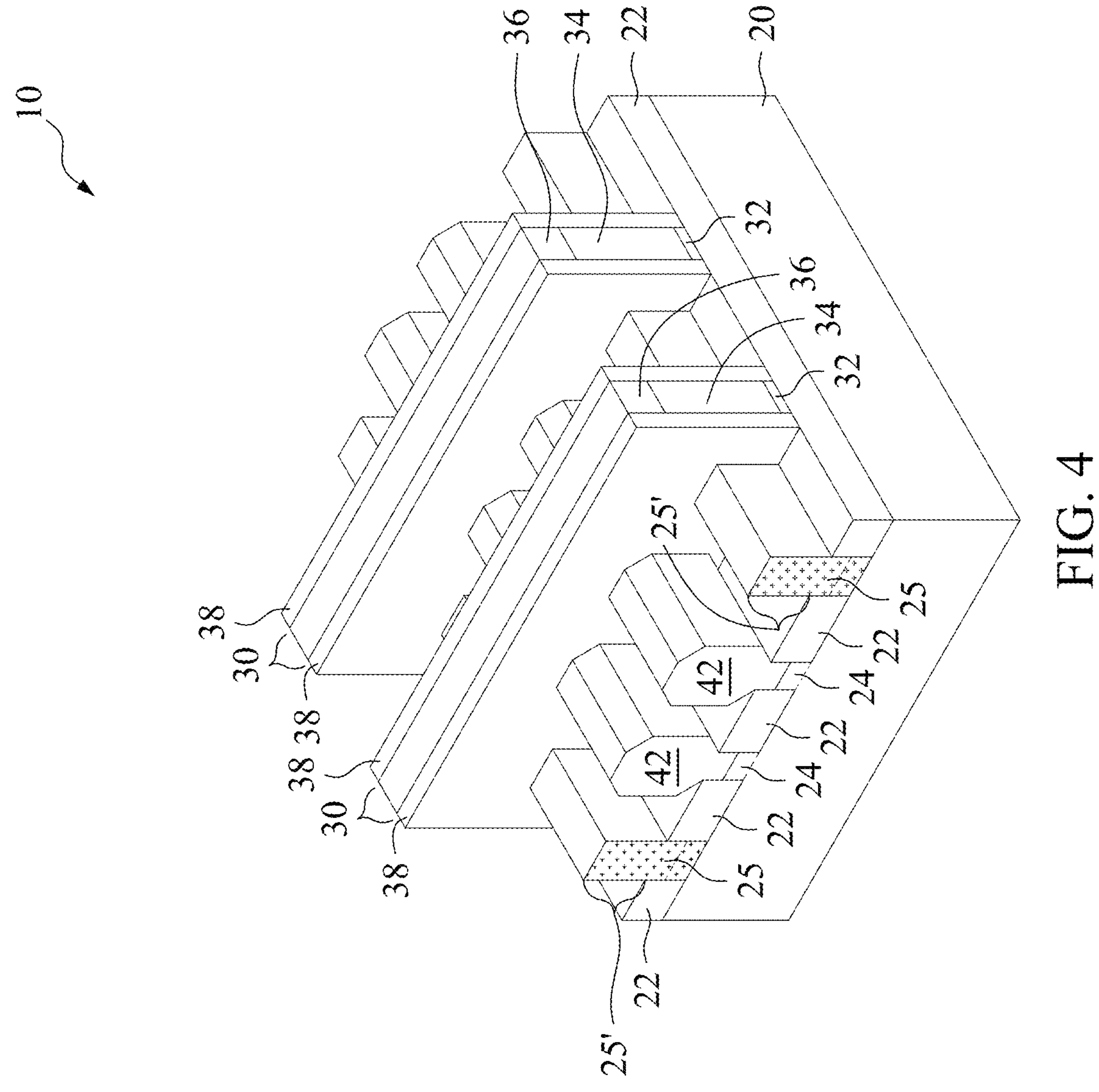

FIG. 4 illustrates the formation of epitaxy regions 42, which act as the source/drain regions of the resulting FinFETs, and hence are alternatively referred to as source/drain regions 42. The respective process is illustrated as process 208 in the process flow 200 as shown in FIG. 21. Source/drain region(s) may refer to a source or a drain, individually or collectively dependent upon the context. In accordance with some embodiments an etching process (referred to as source/drain recessing hereinafter) is performed to etch the portions of protruding fins 24' that are not covered by dummy gate stack 30 and gate spacers 38 to form recesses. The recessing may be anisotropic, and hence the portions of protruding fins 24' directly underlying dummy gate stacks 30 and gate spacers 38 are protected, and are not etched. In the etching process, dielectric dummy fins 25' are not etched. For example, protruding fins 24' may be etched using the mixture of $NF_3$ and $NH_3$, the mixture of HF and $NH_3$, or the like.

Next, epitaxy regions 42 are formed by selectively growing a semiconductor material from the recesses. In accordance with some embodiments, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), SiB, GeB, or the like may be grown. Conversely, when the resulting FinFET is an n-type FinFET, silicon phosphorous (SiP), silicon carbon phosphorous (SiCP), or the like, may be grown. After epitaxy regions 42 fully fill the recesses, epitaxy regions 42 start expanding horizontally, and facets may be formed.

Figure 5:
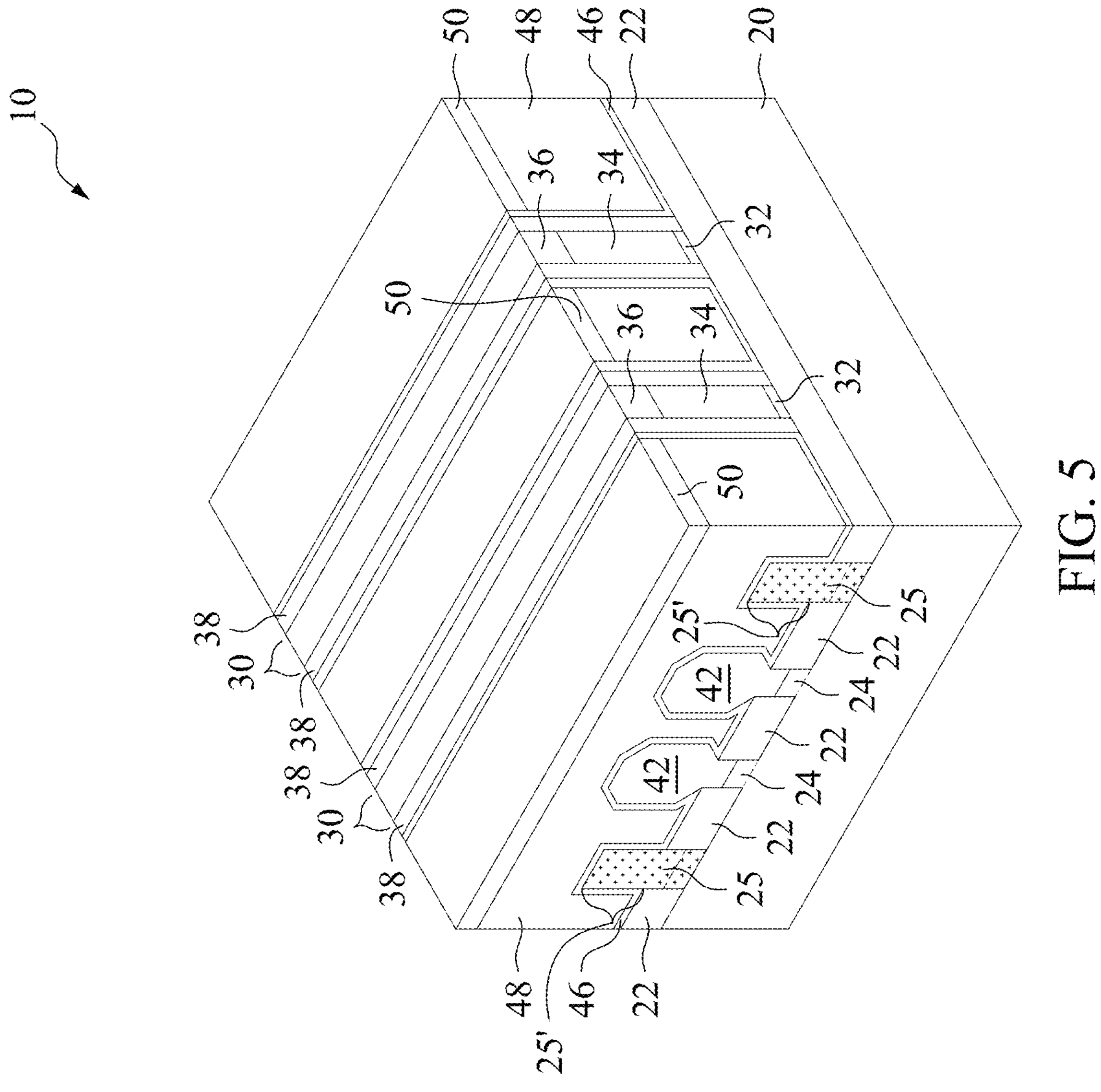

FIG. 5 illustrates a perspective view of the structure after the formation of Contact Etch Stop Layer (CESL) 46 and Inter-Layer Dielectric (ILD) 48. The respective process is illustrated as process 210 in the process flow 200 as shown in FIG. 21. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 48, dummy gate stacks 30, and gate spacers 38 with each other.

FIG. 5 also illustrates the formation of hard masks 50, which are used for protecting ILD 48 in subsequent processes. In accordance with some embodiments, the formation of hard mask 50 includes recessing ILD 48 (and possibly CESL 46) to form recesses between neighboring gate spacers 38, filling a dielectric layer to fill the recesses, and performing a planarization process (such as CMP process or a mechanical grinding process) to remove excess portions of the dielectric material. The remaining portions of the dielectric material are hard masks 50. In accordance with some embodiments, hard masks 50 are formed of or comprise silicon nitride, silicon oxynitride, or the like.

Figure 6:
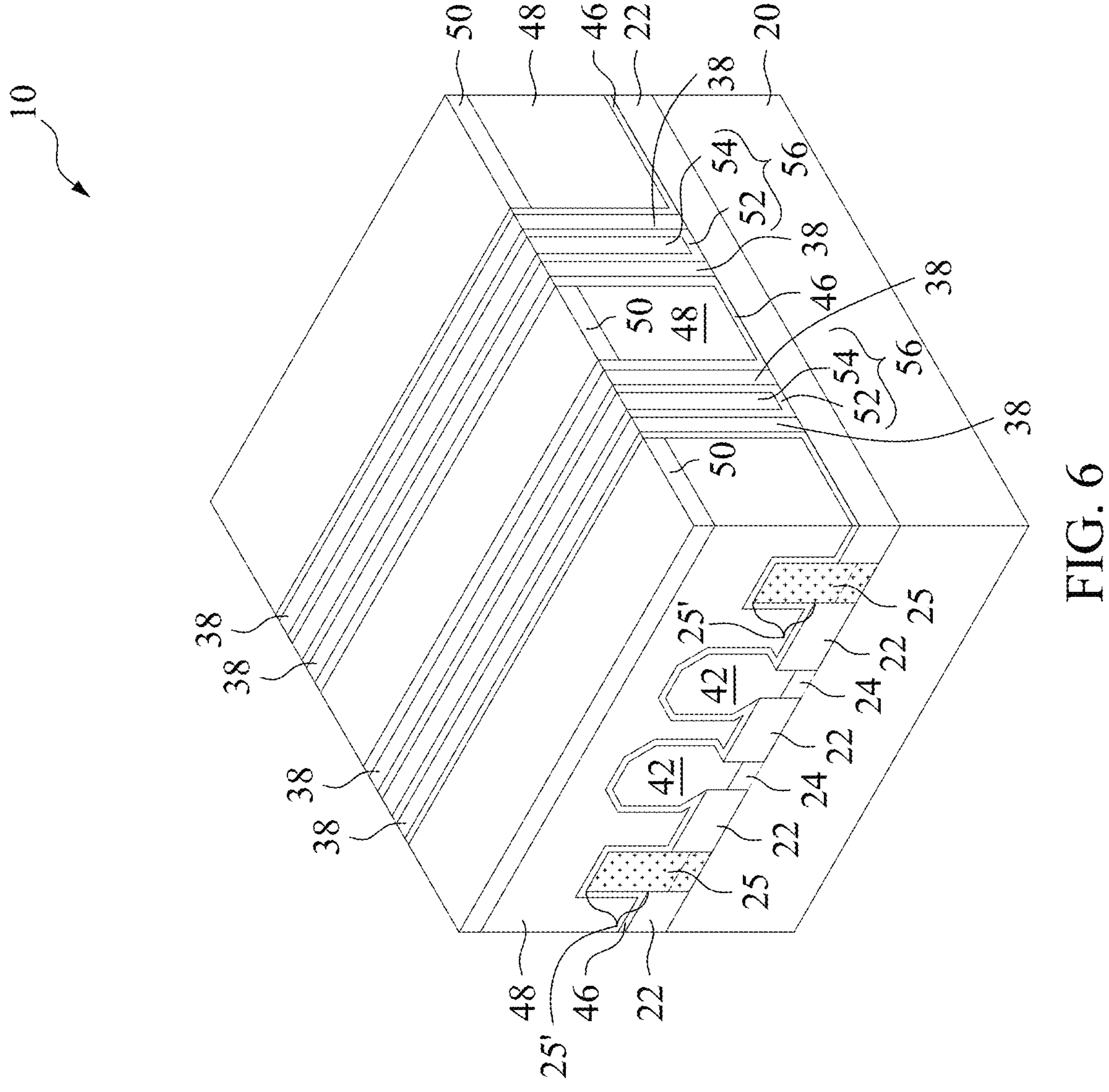

FIG. 6 illustrates the formation of replacement gate stacks 56. The respective process is illustrated as process 212 in the process flow 200 as shown in FIG. 21. The formation process includes removing the dummy gate stacks 30 to form trenches, and forming replacement gate stacks 56 in the resulting trenches. Gate stacks 56 include gate dielectrics 52 and gate electrodes 54. Gate dielectrics 52 may include interfacial layers and high-k dielectric layers over the interfacial layers. The interfacial layers may include silicon oxide. The high-k dielectric layers may include hafnium oxide, zirconium oxide, lanthanum oxide, and/or the like. Gate electrodes 54 may include work function layers comprising TiN, TiSiN, TaN, TiAlN, TiAl, and/or the like, and may or may not include filling metals formed of cobalt, tungsten, and/or the like. Accordingly, gate electrodes 54 are also referred to as metal gates 54.

Next, the formation process proceeds to the cutting of gate stacks 56 and the cutting of protruding fins 24' in order to isolate transistors. The cutting of gate stacks 56 is referred to as a Cut Metal Gate (CMG) process. The cutting of protruding semiconductor fins 24' is referred to as a Continuous Metal On-Diffusion Edge (CMODE) process, or sometimes referred to as a Cut Metal on-Diffusion Edge (also CMODE) process. It is appreciated that in the illustrated example embodiments, a CMODE process is performed, in which the cutting of protruding semiconductor fins 24' is performed after the formation of replacement gate stacks 56. In accordance with alternative embodiments, the cutting of protruding semiconductor fins 24' may be performed before the formation of replacement gate stacks 56, and dummy gate stacks 30 (FIG. 5) are cut. The corresponding process are thus referred to as a Continuous Poly On Diffusion Edge (CPODE) process or a Cut Poly On Diffusion Edge (CPODE) process.

Figure 7:
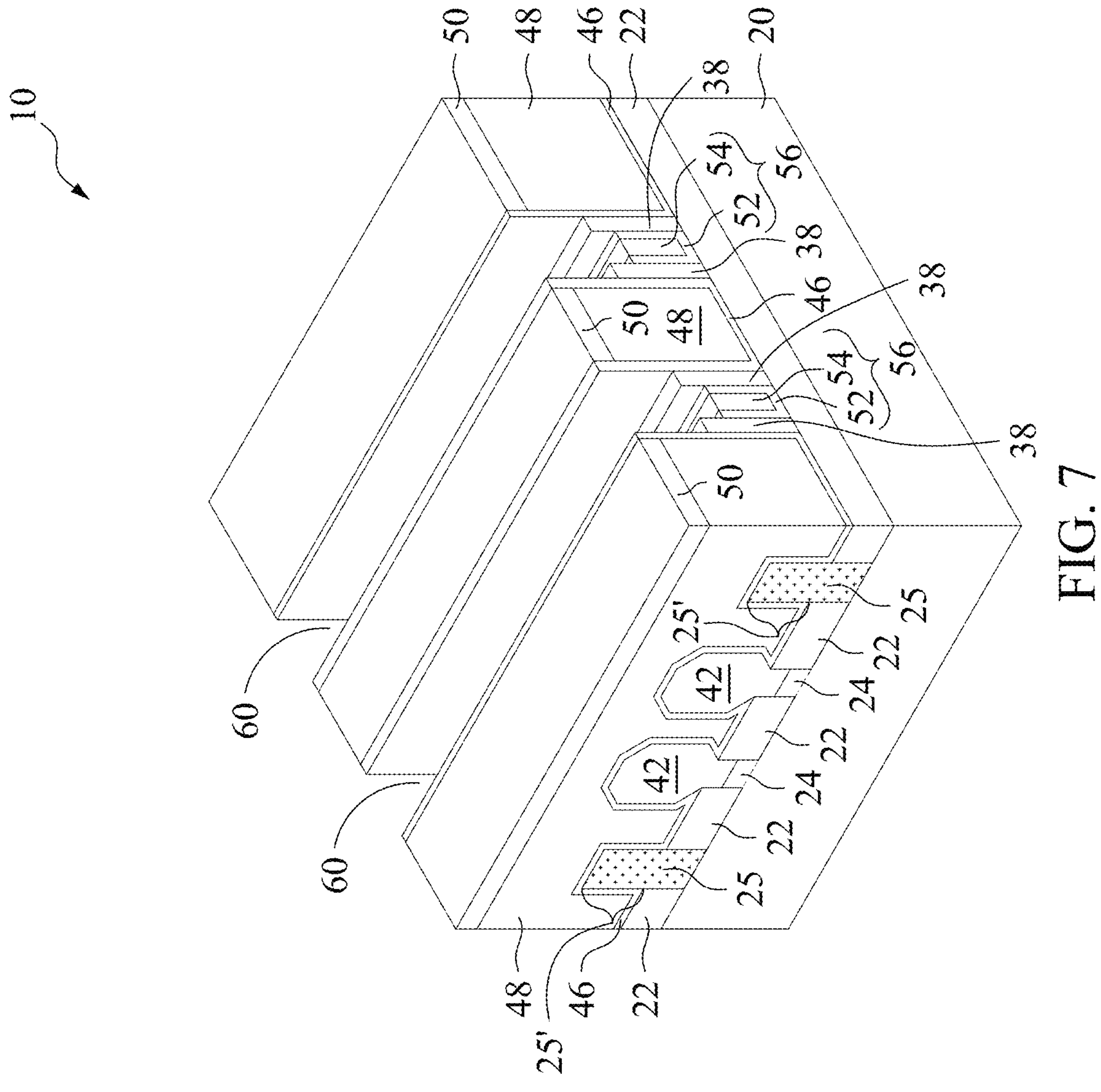

Referring to FIG. 7, replacement gate stacks 56 are recessed through etching processes to form recesses 60, so that the height of replacement gate stacks 56 is reduced. The respective process is illustrated as process 214 in the process flow 200 as shown in FIG. 21. In the etching process, hard masks 50 protect the underlying ILD 48. In accordance with some embodiments, gate spacers 38 are also recessed as shown in FIG. 7. In accordance with alternative embodiments, gate spacers 38 are not recessed.

Figure 8:
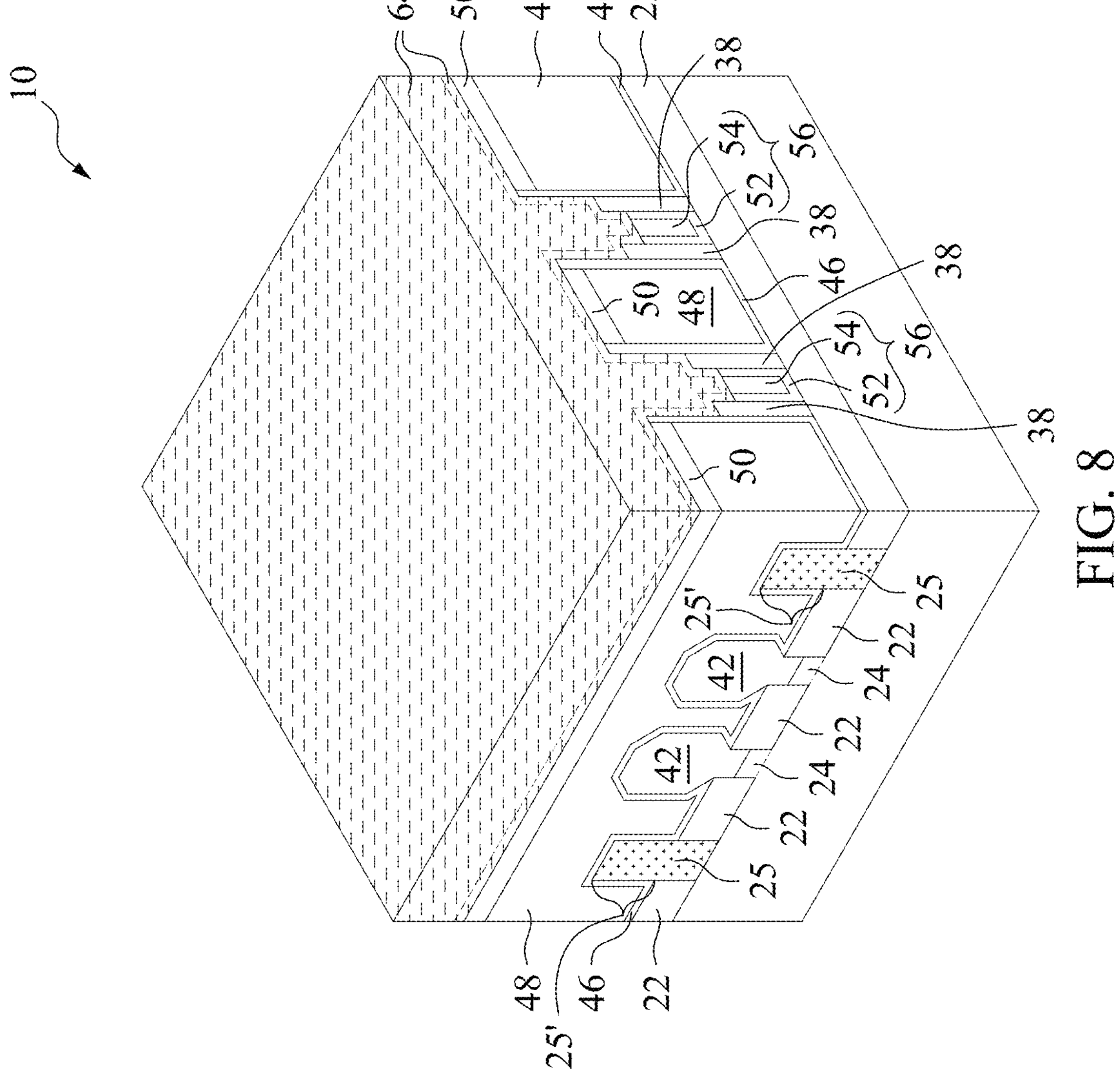

Referring to FIG. 8, hard mask 64 is formed. The respective process is illustrated as process 216 in the process flow 200 as shown in FIG. 21. The formation process may include depositing a hard mask layer(s), and performing a planarization process such as a CMP process or a mechanical grinding process to level the top surface of hard mask 64. Hard mask 64 extends into recesses 60 (FIG. 7). In accordance with some embodiments, hard mask 64 is formed of a homogeneous material such as amorphous silicon. In accordance with alternative embodiments, hard mask 64 may be a composite layer including a plurality of layers. For example, hard mask layer 64 may include a first layer (which may be a conformal layer) and a second layer over the first layer. For example, the dashed lines represent the interface between the first layer and the second layer as an example. The first layer may be formed of or comprise silicon nitride, while the second layer may include amorphous silicon in accordance with some embodiments. Hard mask 64 may or may not include a third layer such as a silicon nitride layer deposited on the planarized second layer.

Figure 9A:
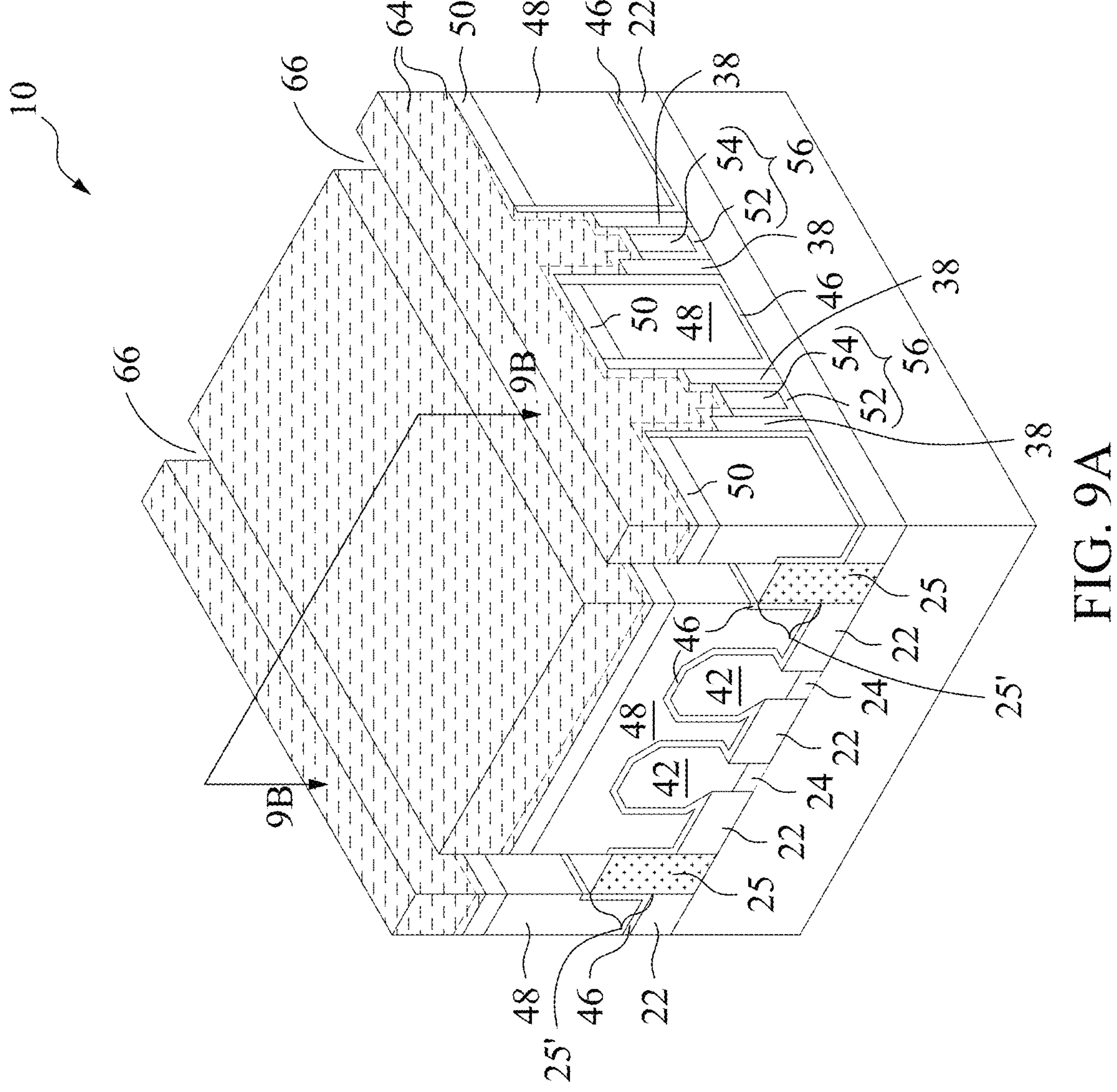
Figure 9B:
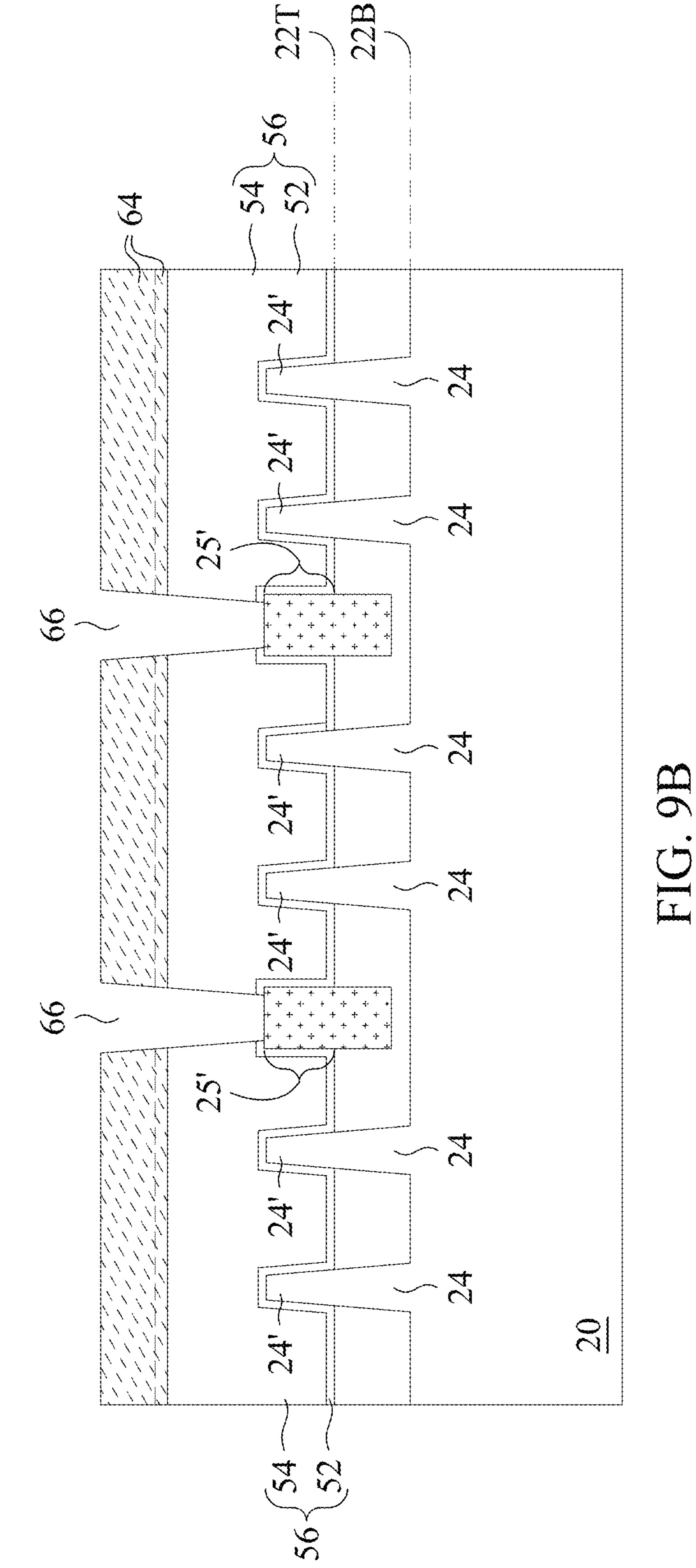
Figure 10:
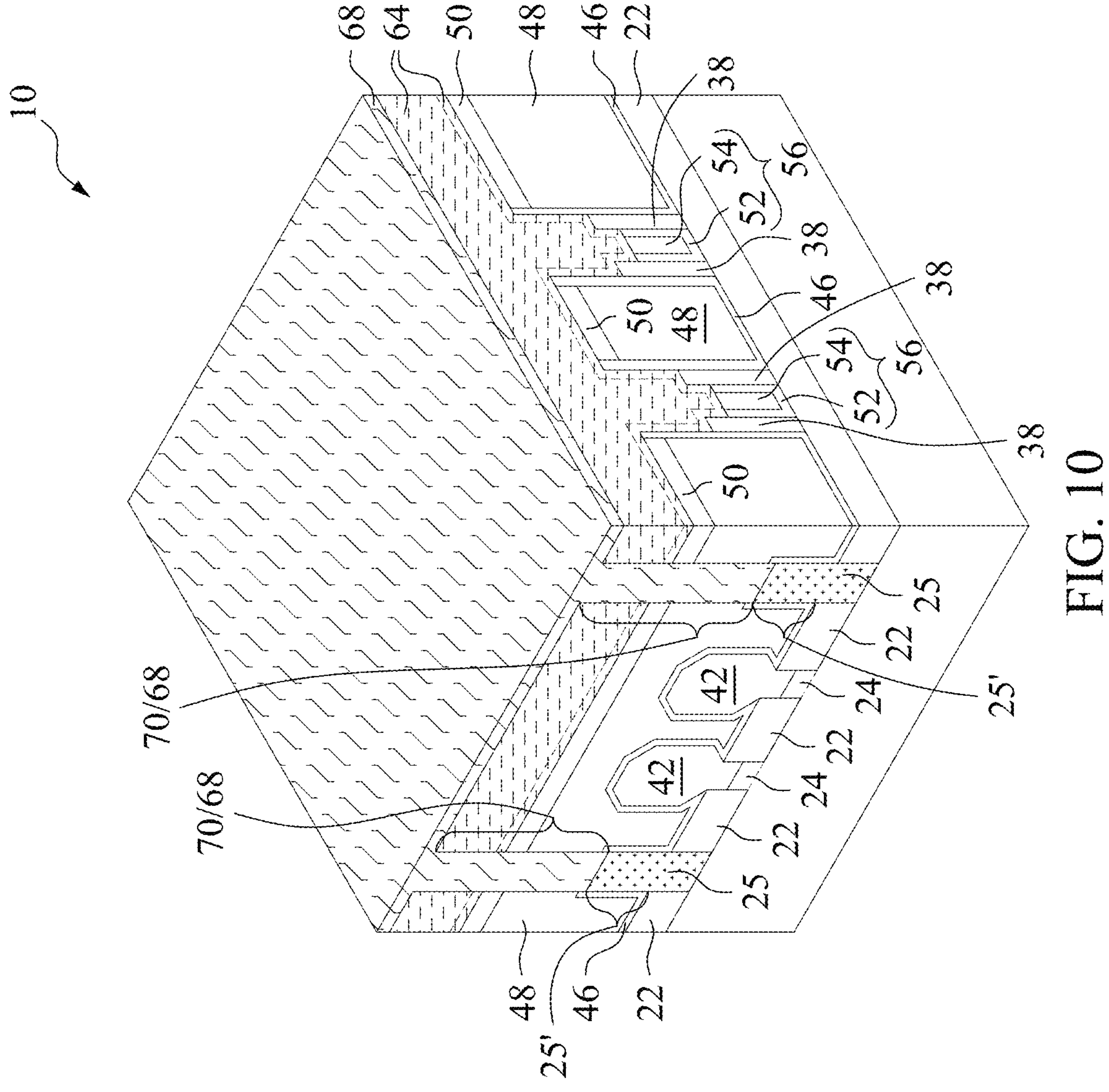

FIGS. 9A, 9B, and 10 illustrate a CMG process in accordance with some embodiments. As shown in FIG. 9A, an etching process is performed. The etching process may include forming an etching mask (such as a photoresist or a tri-layer etching mask, not shown), patterning the etching mask, and etching hard masks 64 and 50, ILD 48. CESL 46, and replacement gate stack 56 to form trenches 66.

FIG. 9B illustrates the cross-section 9B-9B as shown in FIG. 9A. Replacement gate stack 56 is cut apart into separate portions. The top surfaces of dielectric dummy fins 25' may be exposed to trenches 66. The respective process is illustrated as process 218 in the process flow 200 as shown in FIG. 21.

Referring to FIG. 10, dielectric material 68 is deposited. The respective process is illustrated as process 220 in the process flow 200 as shown in FIG. 21. In accordance with some embodiments, dielectric material 68 is formed of a homogeneous dielectric material such as silicon nitride, silicon oxide, or the like. In accordance with alternative embodiments, dielectric material 68 comprises a plurality of dielectric layers. For example, dielectric material 68 may comprise a dielectric liner formed of a first dielectric material, and a second dielectric material over the dielectric liner. The second dielectric material is different from the first dielectric material. For example, the first dielectric material may comprise silicon oxide, and the second dielectric material may comprise silicon nitride. Alternatively, the first dielectric material may comprise silicon nitride, and the second dielectric material may comprise silicon oxide.

The formation of dielectric material 68 includes depositing the dielectric material(s), and performing a planarization process to level the top surface of the dielectric material(s). In accordance with some embodiments, after the planarization process, a portion of the dielectric material 68 may be left overlapping hard mask 64 to act as a hard mask layer. In accordance with alternative embodiments, the planarization process is performed until the top surface of hard mask 64 is exposed, and another hard mask may be deposited on the remaining hard mask 64. The portions of dielectric material 68 in trenches 66 (FIGS. 9A and 9B) are referred to as gate isolation regions 70 hereinafter, which are also referred to as CMG regions 70. Some example gate isolation regions 70 are shown in FIG. 16C, which illustrates a top view.

FIGS. 11A, 11B, 11C, 12A, 12B, 13A, 13B, 14A, 14B, 15A, and 15B illustrate the intermediate stages in a CMODE process, in which fin isolation regions are formed to cut semiconductor strips and the underlying bulk portion of semiconductor substrate.

Figure 11A:
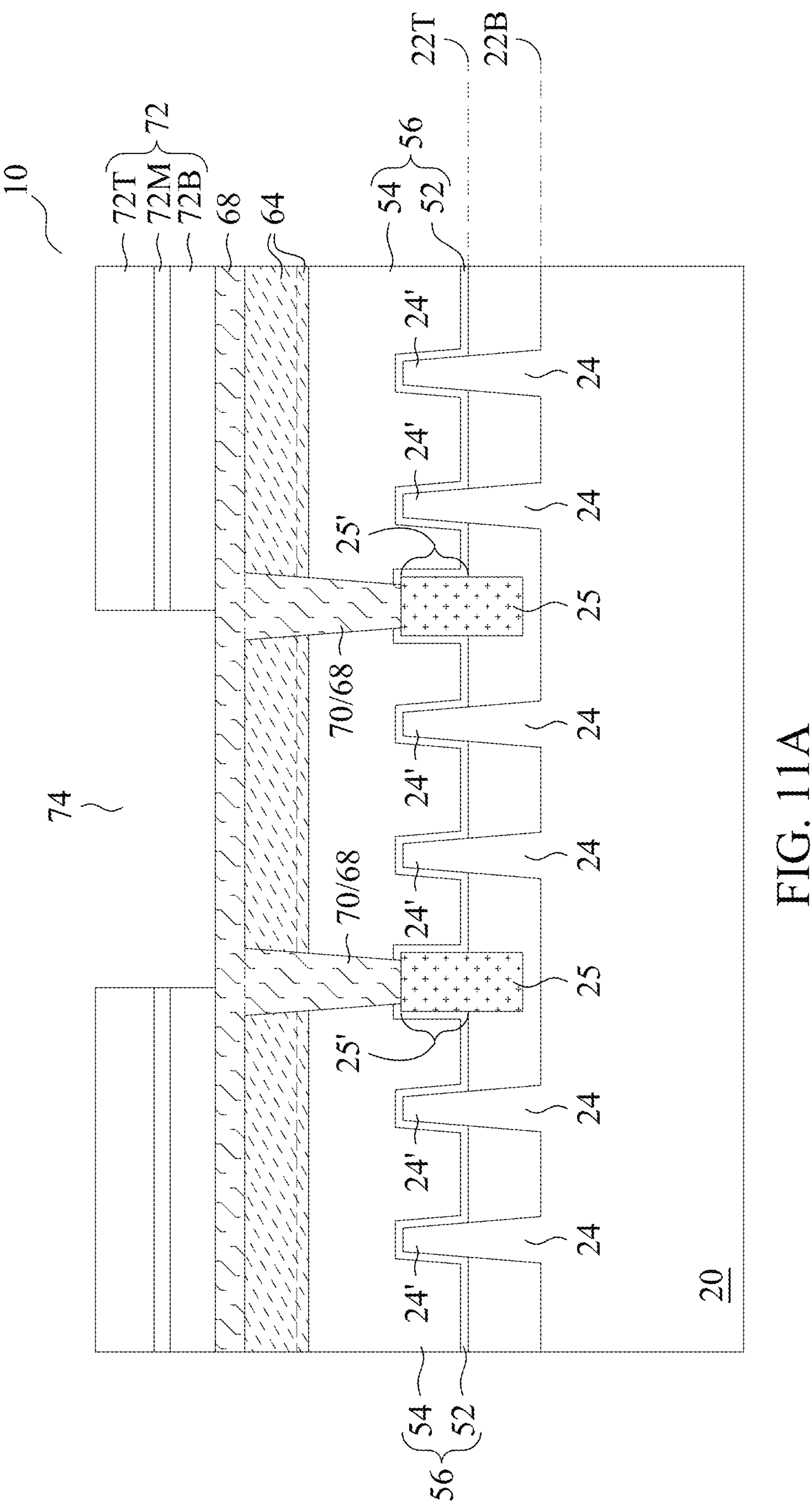
Figure 11B:
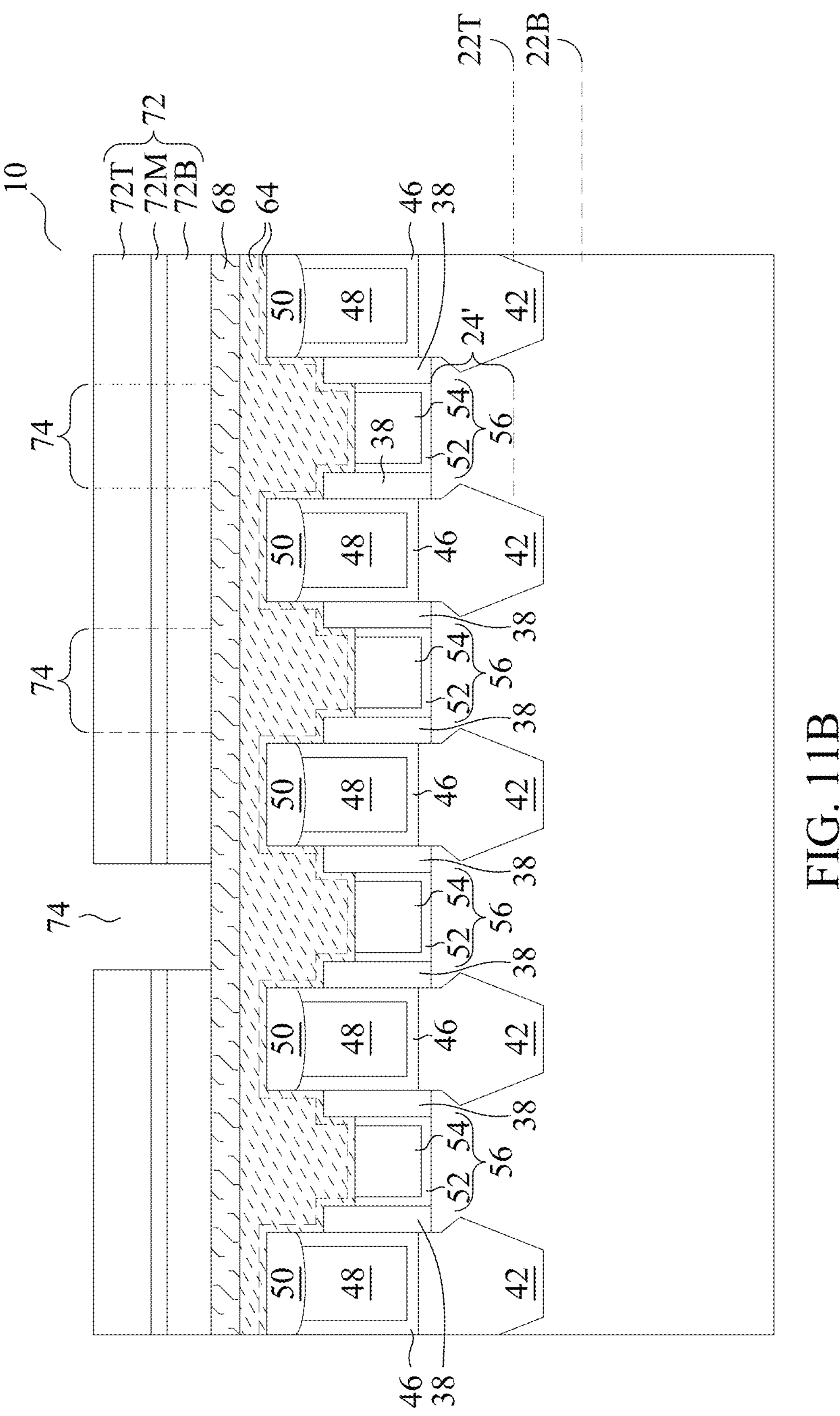
Figure 11C:
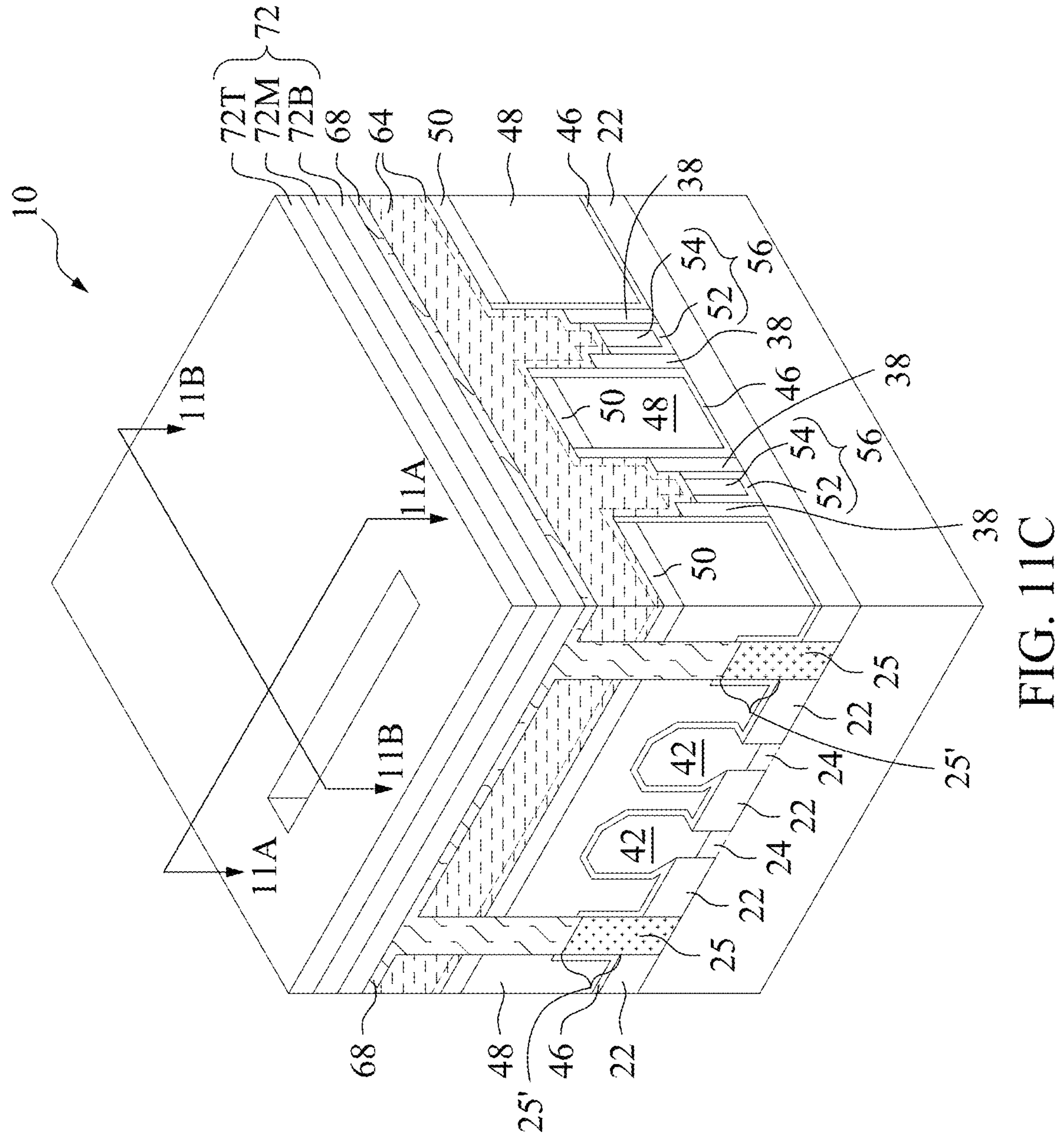

FIG. 11C illustrates a perspective view in the formation of etching mask 72 in accordance with some embodiments. The respective process is illustrated as process 222 in the process flow 200 as shown in FIG. 21. Etching mask 72 may be a tri-layer, which may include bottom layer 72B, middle layer 72M over bottom layer 72B, and top layer 72T over middle layer 72M. In accordance with some embodiments, bottom layer 72B may comprise a carbon-containing dielectric material, a cross-linked photoresist, or the like. Middle layer 72M may include an inorganic material such as silicon oxynitride. Top layer 72T may comprise photoresist, which is patterned to form opening 74. Middle layer 72M and bottom layer 72B are subsequently patterned using the patterned top layer 72T as an etching mask.

FIGS. 11A and 11B illustrate the cross-sectional views of vertical cross-sections 11A-11A and 11B-11B, respectively of FIG. 11C. As shown in FIG. 11A, opening 74 overlaps a part of each of the two dummy fins 25', and also overlaps the protruding semiconductor fins 24' in between. As shown in FIG. 11B, opening 74 overlaps one of replacement gate stack 56. In accordance with some embodiments, as shown in FIG. 11B, a single opening 74 is formed, and on one or both sides of the opening 74, there are a plurality of replacement gate stacks 56 with no openings 74 overlapping them. In accordance with alternative embodiments, a plurality of openings 74 (shown as being dashed) may be formed, each overlapping one of a plurality of neighboring replacement gate stacks 56.

In subsequent processes, figures may be referred to using a number followed by letter "A" or "B." The figures whose figure numbers including letter "A" are obtained from the same cross-section as the cross-section of FIG. 11A, and the figures whose figure numbers including letter "B" are obtained from the same cross-section as the cross-section of FIG. 11B.

Figure 12A:
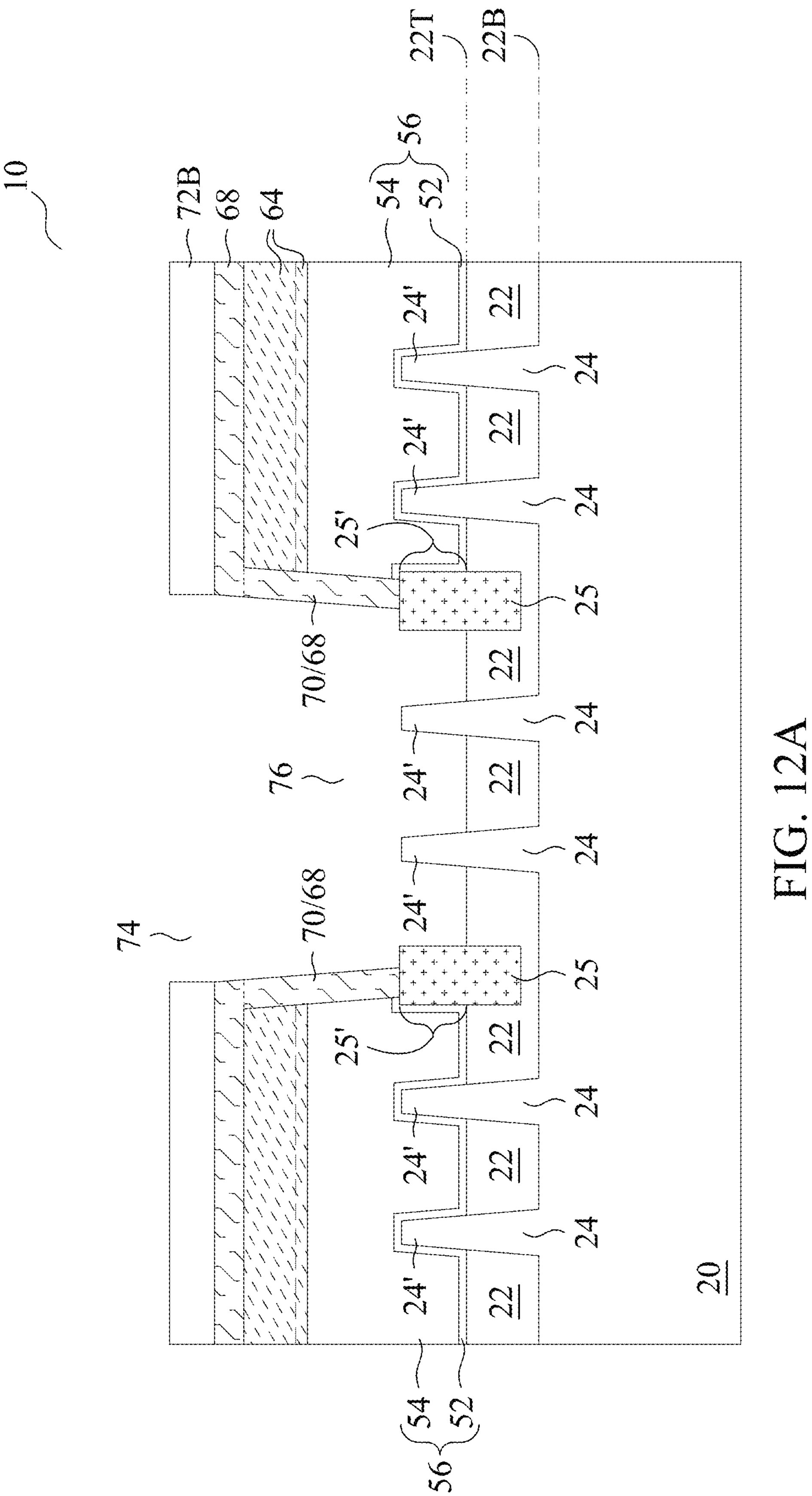
Figure 12B:
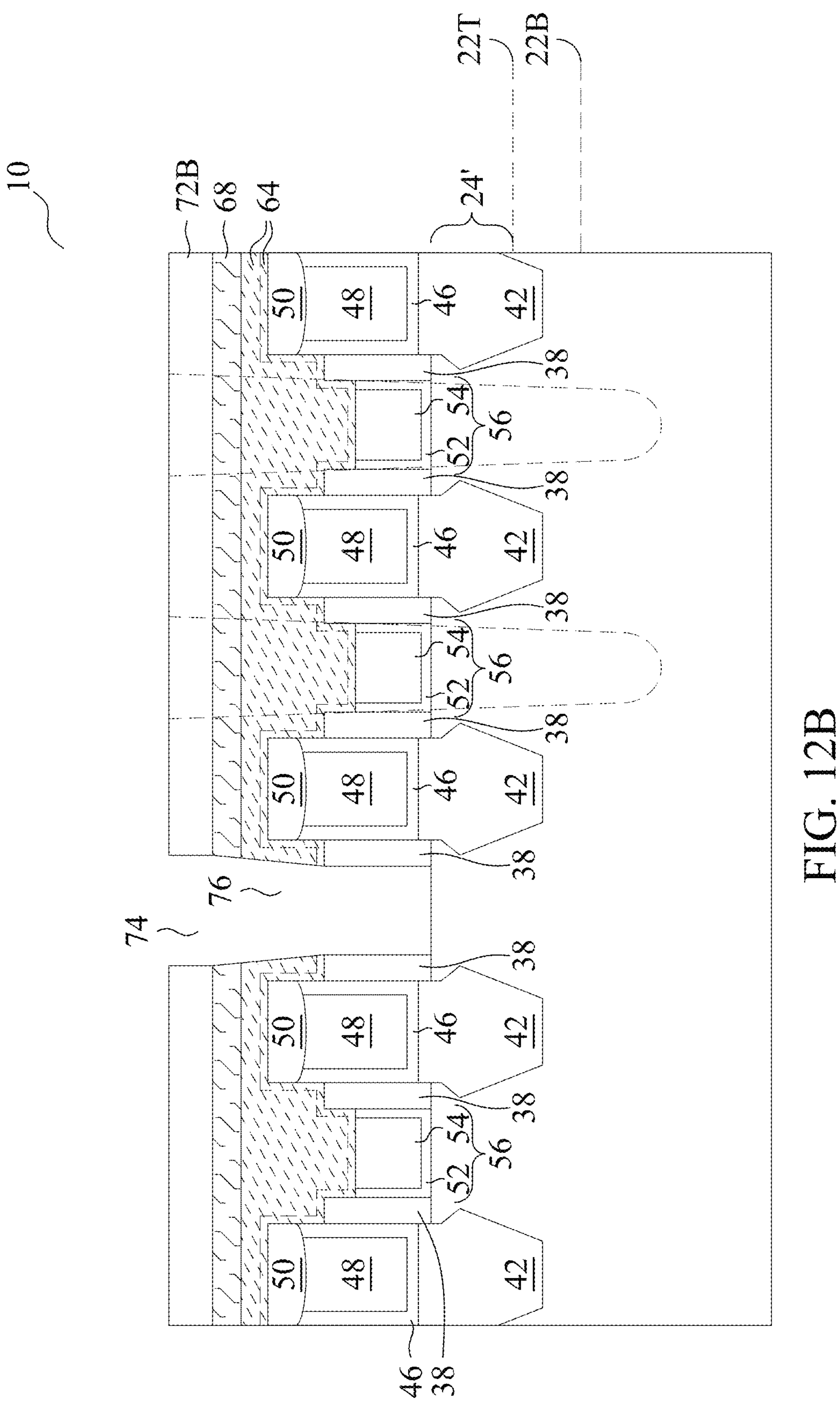

Etching mask 72 is then used to etch the underlying dielectric material 68, hard masks 64, gate isolation regions 70, and replacement gate stacks 56, so that trenches 76 are formed extending into replacement gate stacks 56. The respective process is illustrated as process 224 in the process flow 200 as shown in FIG. 21. The resulting structure is shown in FIGS. 12A and 12B. In the etching process, top layer 72T and middle layer 72M (FIGS. 11A and 11B) may be consumed. Protruding semiconductor fins 24' are exposed. The etching may include a plurality of etching processes. For example, the etching of dielectric material 68 and hard mask layers 64 may be performed using $CF_4$, $CH_2F_2$, $CH_3F$, HF, $O_2$, Ar, or combinations thereof, depending on the respective material. The etching of replacement gate stacks 56 may be performed using HCl, $H_2O_2$, and $H_2O$, or the like, or combinations thereof. After the etching process, protruding semiconductor fins 24' are exposed.

Figure 13A:
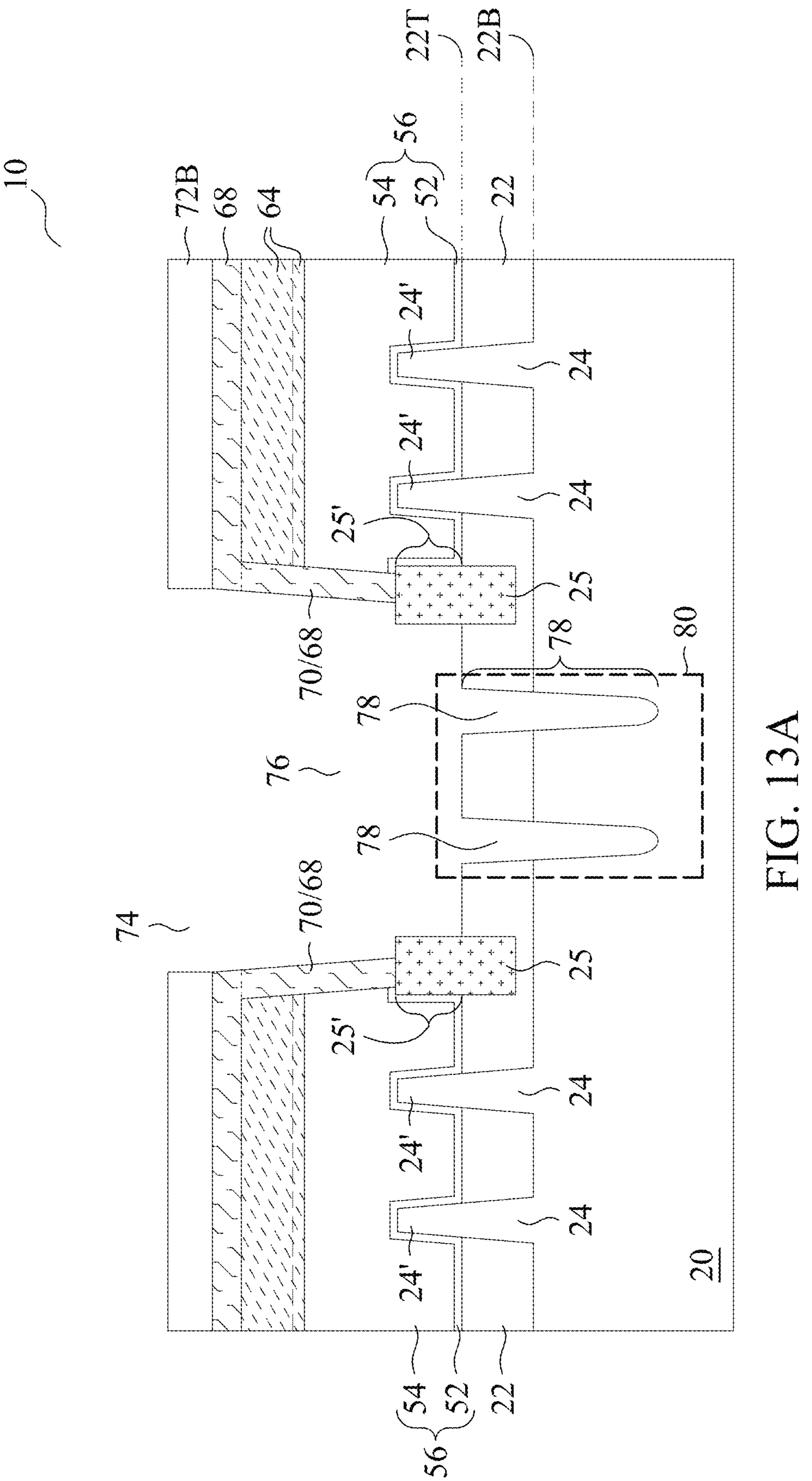
Figure 13B:
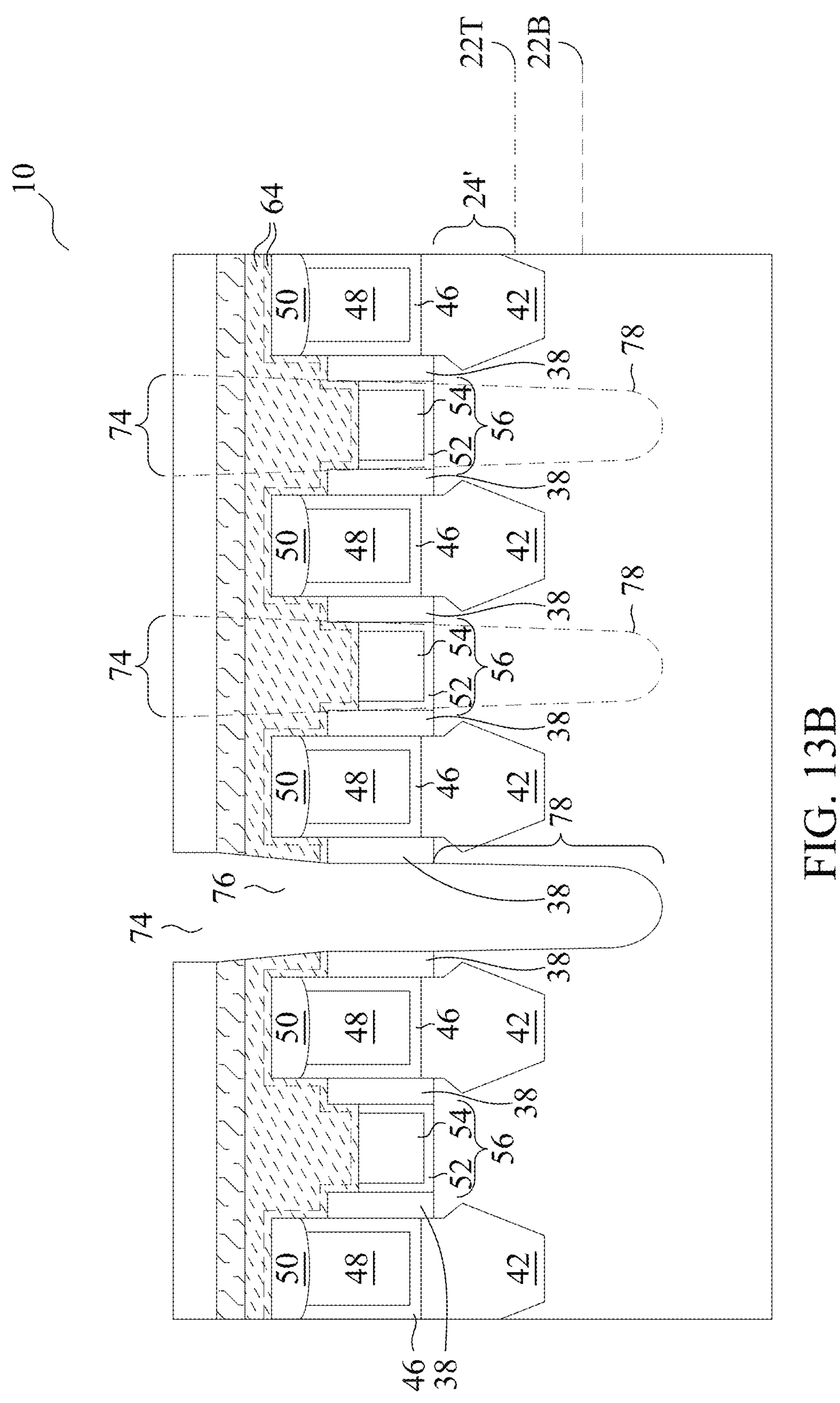

Next, protruding fins 24' are etched. After the protruding fins 24' are removed, the underlying semiconductor strips 24, which are between STI regions 22, are also etched, resulting in trenches 78. The respective process is illustrated as process 226 in the process flow 200 as shown in FIG. 21. The resulting structure is shown in FIGS. 13A and 13B. The etching process is performed until the resulting trenches 78 have bottoms lower than the bottom surfaces 22B of STI regions 22. Accordingly, trenches 78 further extend into the bulk portion of substrate 20 below STI regions 22. The details of the etching process will be discussed referring to FIGS. 17 and 18. In accordance with some embodiments, as discussed in detail referring to FIGS. 17 and 18, the etching process and/or the etching tool are selected, so that outmost trenches 78L and 78R have same depths or a same depth as inner trenches 78.

FIG. 13B illustrates a cross-sectional view of the structure shown in FIG. 13A. In accordance with some embodiments, there is a single opening 74, and hence there may be a single trench 78. In accordance with alternative embodiments, a plurality of openings 74 are formed overlapping neighboring replacement gate stacks 56, and hence a plurality of trenches 78 (shown as being dashed) are formed to be parallel to each other in the illustrated cross-section.

Figure 14A:
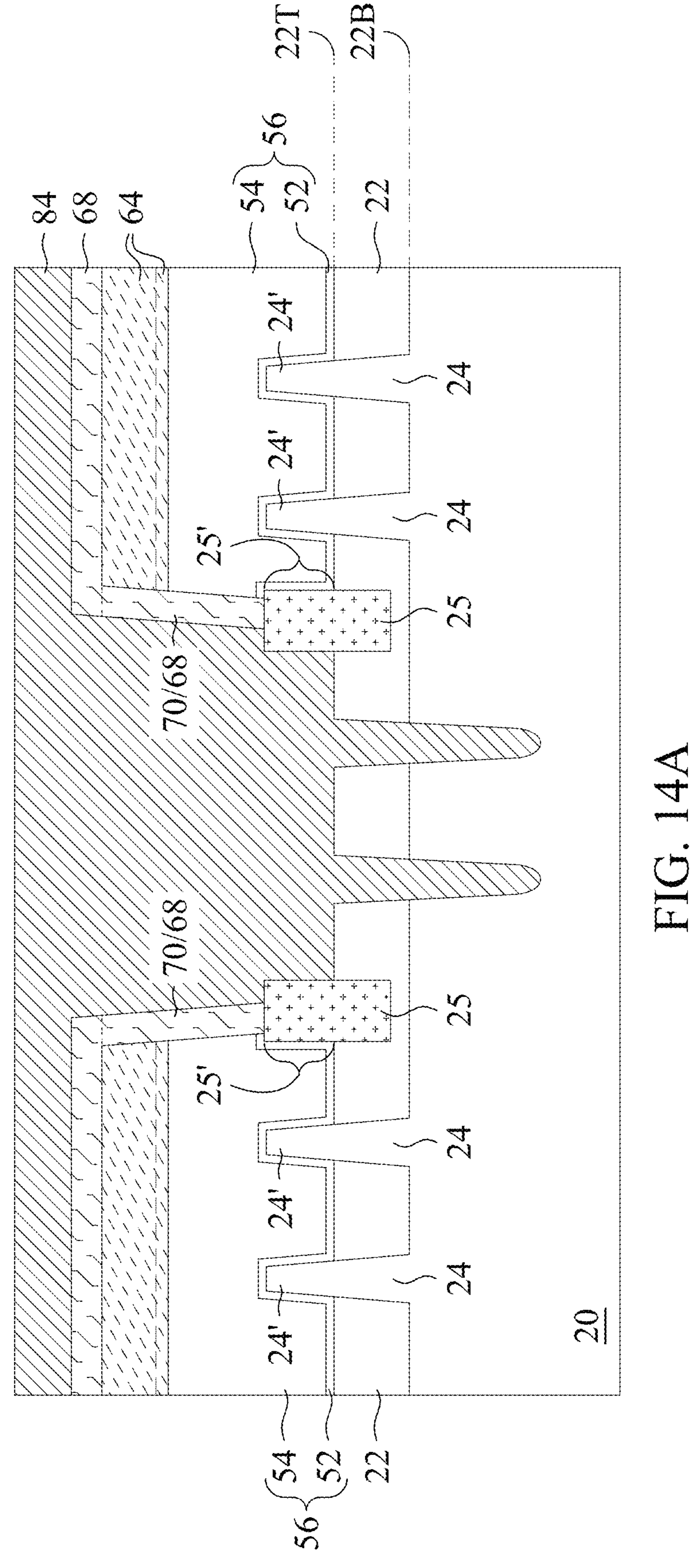
Figure 14B:
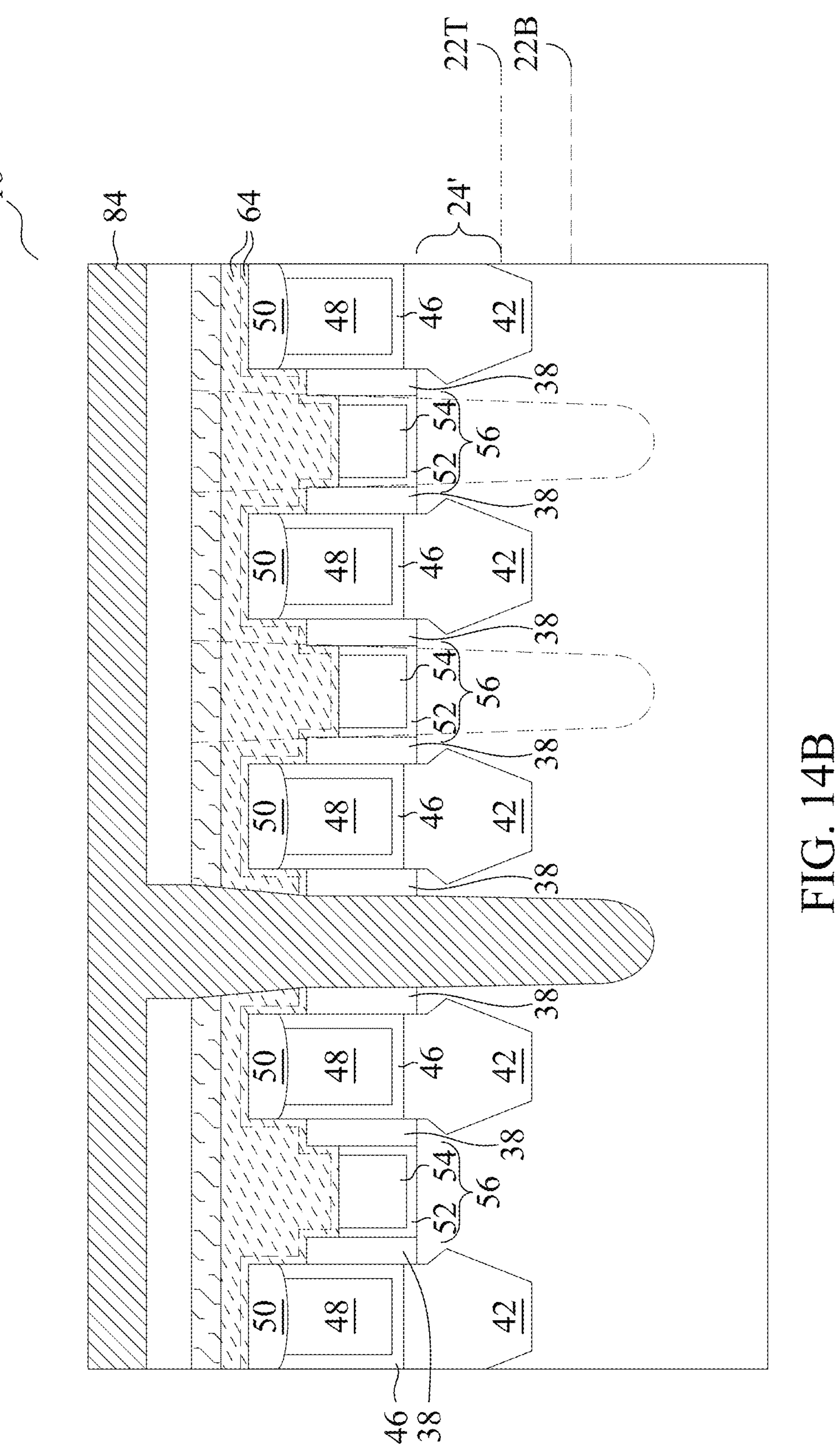

Next, trenches 78 and 76 are filled with dielectric material 84, as shown in FIGS. 14A and 14B. The respective process is illustrated as process 228 in the process flow 200 as shown in FIG. 21. In accordance with some embodiments, dielectric material 84 is formed of a homogeneous dielectric material such as silicon nitride, silicon oxide, or the like. In accordance with alternative embodiments, dielectric material 84 comprises a plurality of dielectric layers, which may be selected from the same group of candidate materials used for forming dielectric material 68, the details are thus not discussed herein.

Figure 15A:
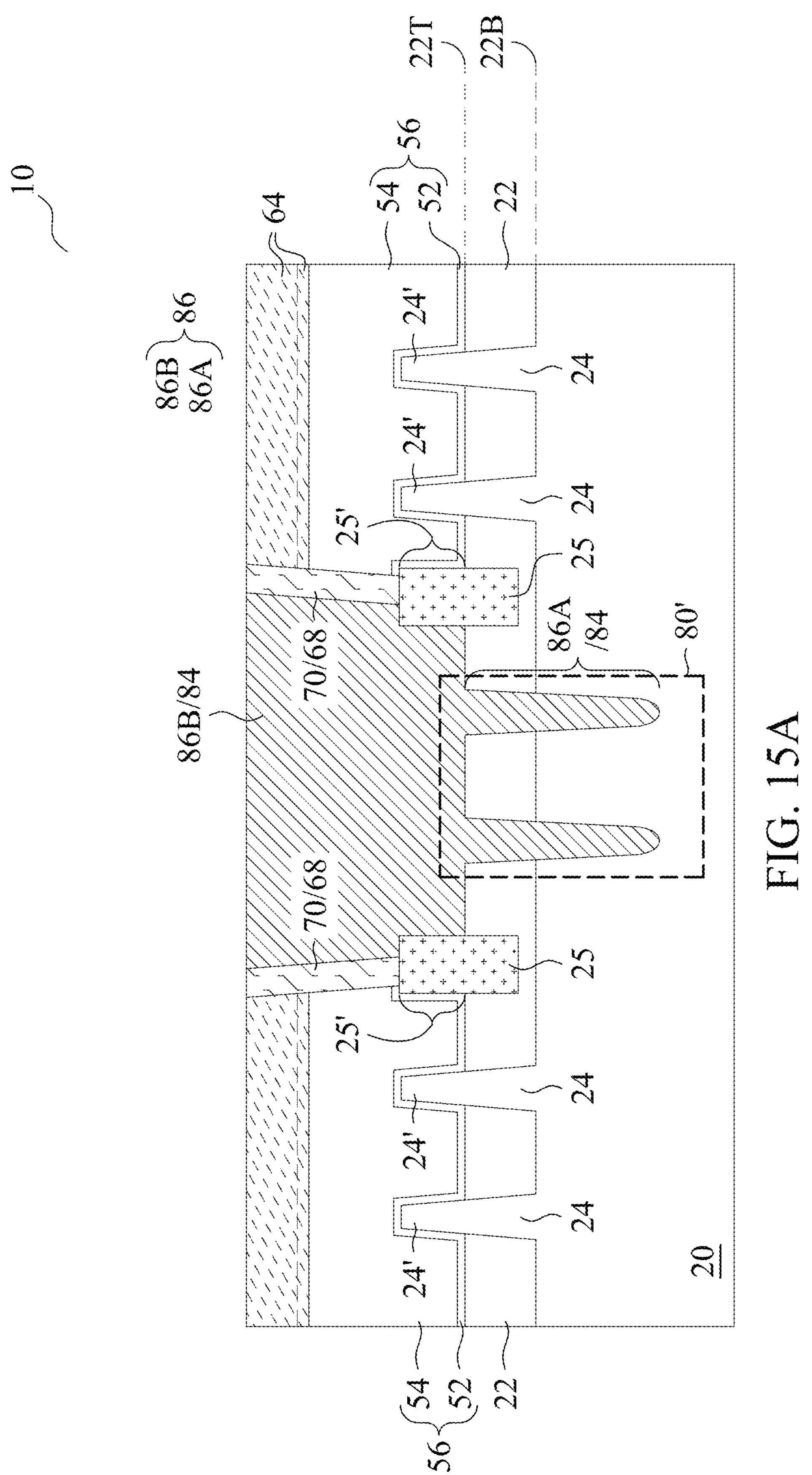
Figure 15B:
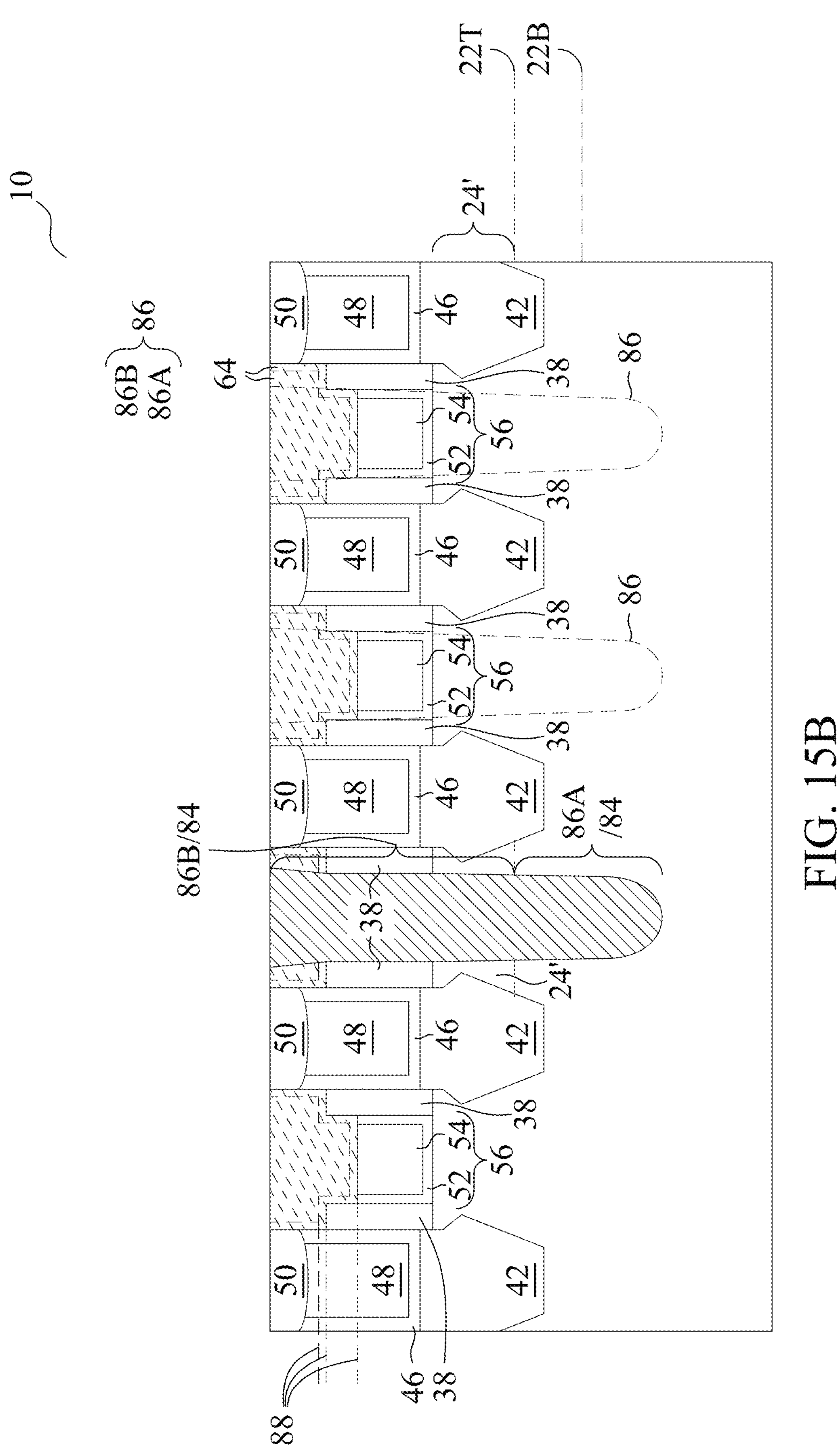

FIGS. 15A and 15B illustrate a planarization process to remove excess portions of dielectric material 84. The respective process is illustrated as process 230 in the process flow 200 as shown in FIG. 21. As a result, the remaining portions of dielectric material 84 are referred to as fin isolation regions 86, which are also referred to as CMODE regions 86. Fin isolation regions 86 include lower isolation regions (portions) 86A, which extend into STI regions 22 and the bulk portion of semiconductor substrate 20, and upper regions (portions) 86B, which extends into gate stack 56.

In accordance with some embodiments, as shown in FIGS. 15A and 15B, the planarization process is performed using hard mask 64 as a CMP stop layer, and hence the top surface of hard mask 64 are exposed. In accordance with alternative embodiments, the planarization process may be stopped at one of possible levels 88 as shown in FIG. 15B. As shown by dashed lines 86, there may also be a plurality of fin isolation regions 86 formed neighboring to each other as a group.

Figure 16A:
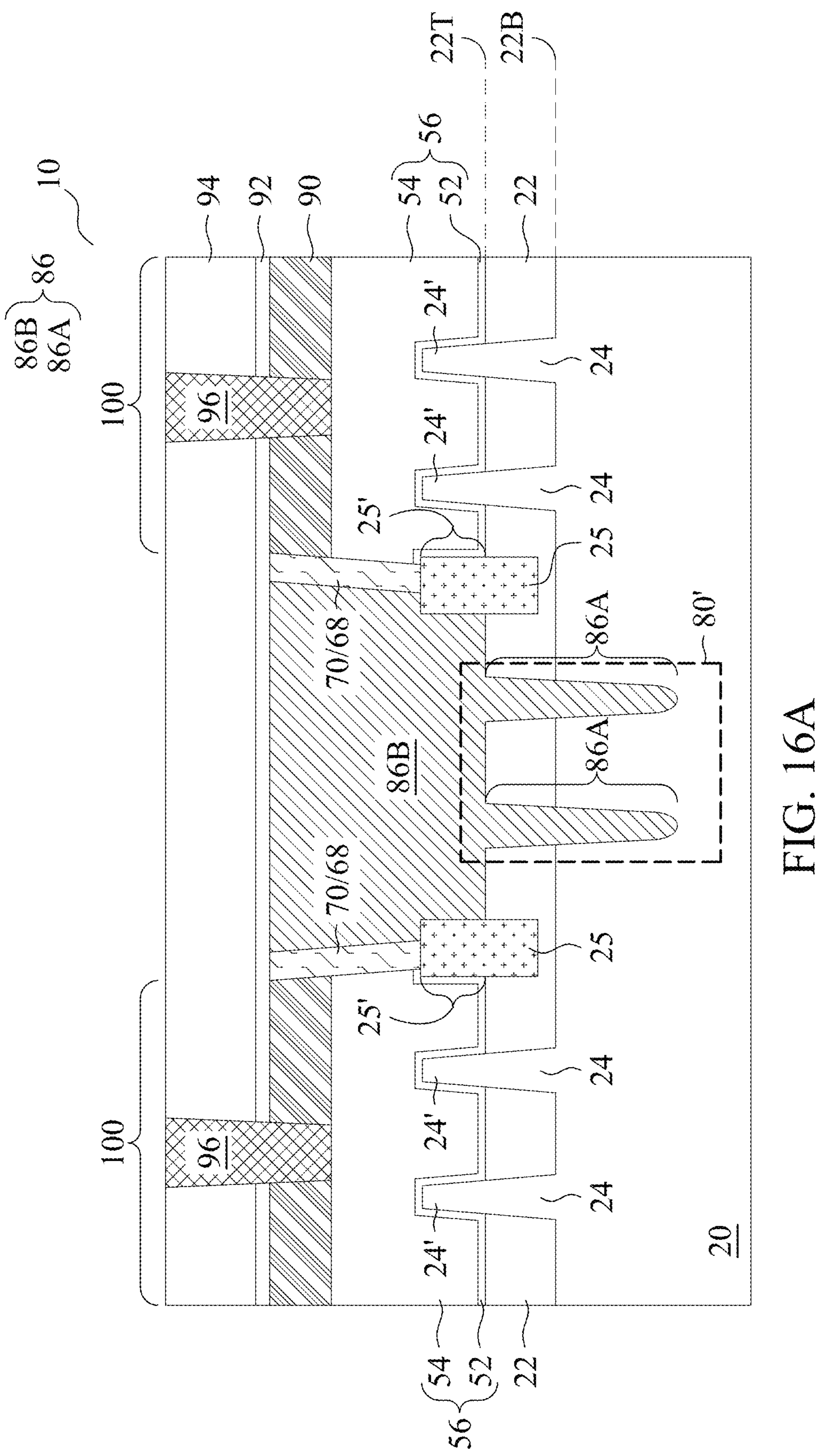
Figure 16B:
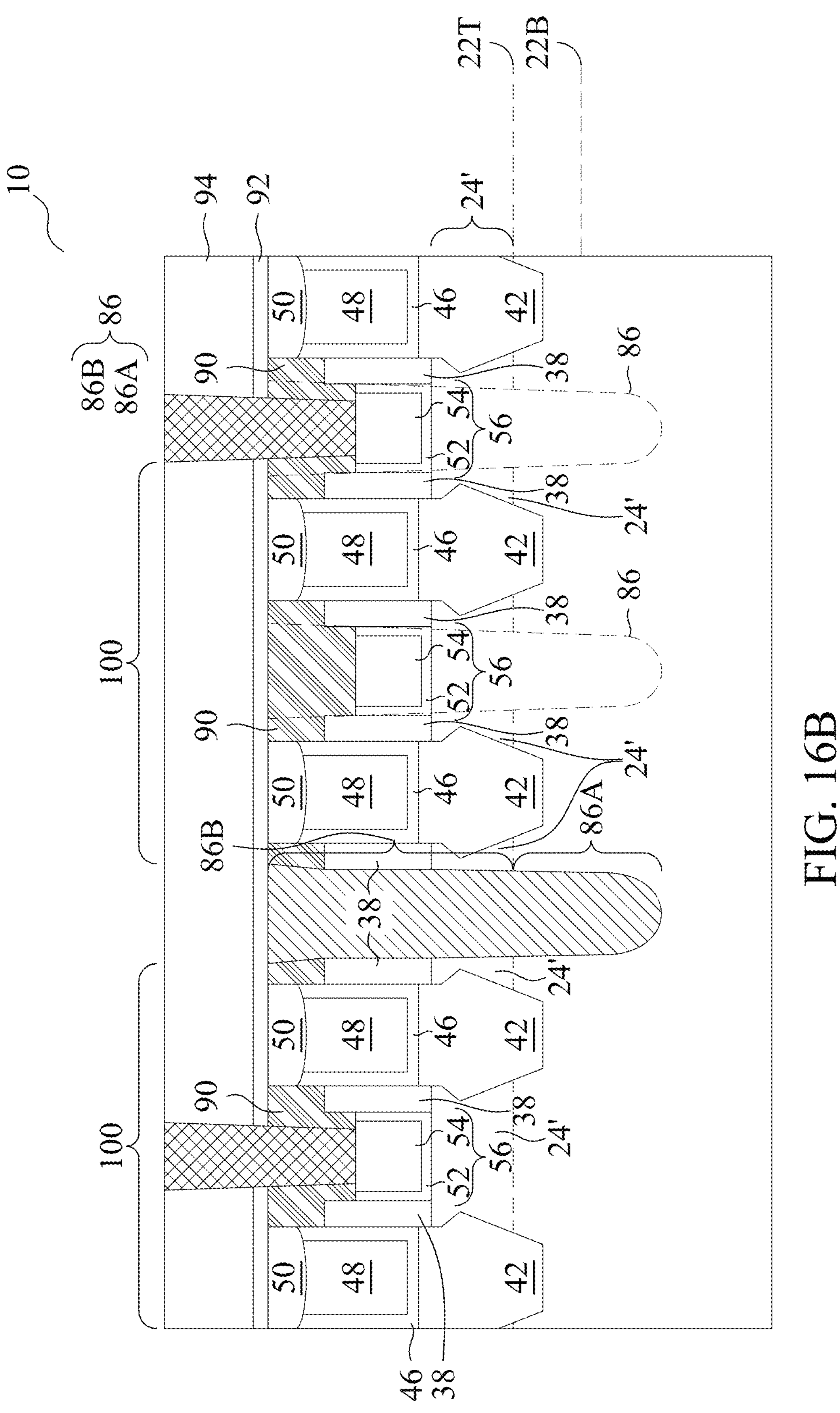
Figure 16C:
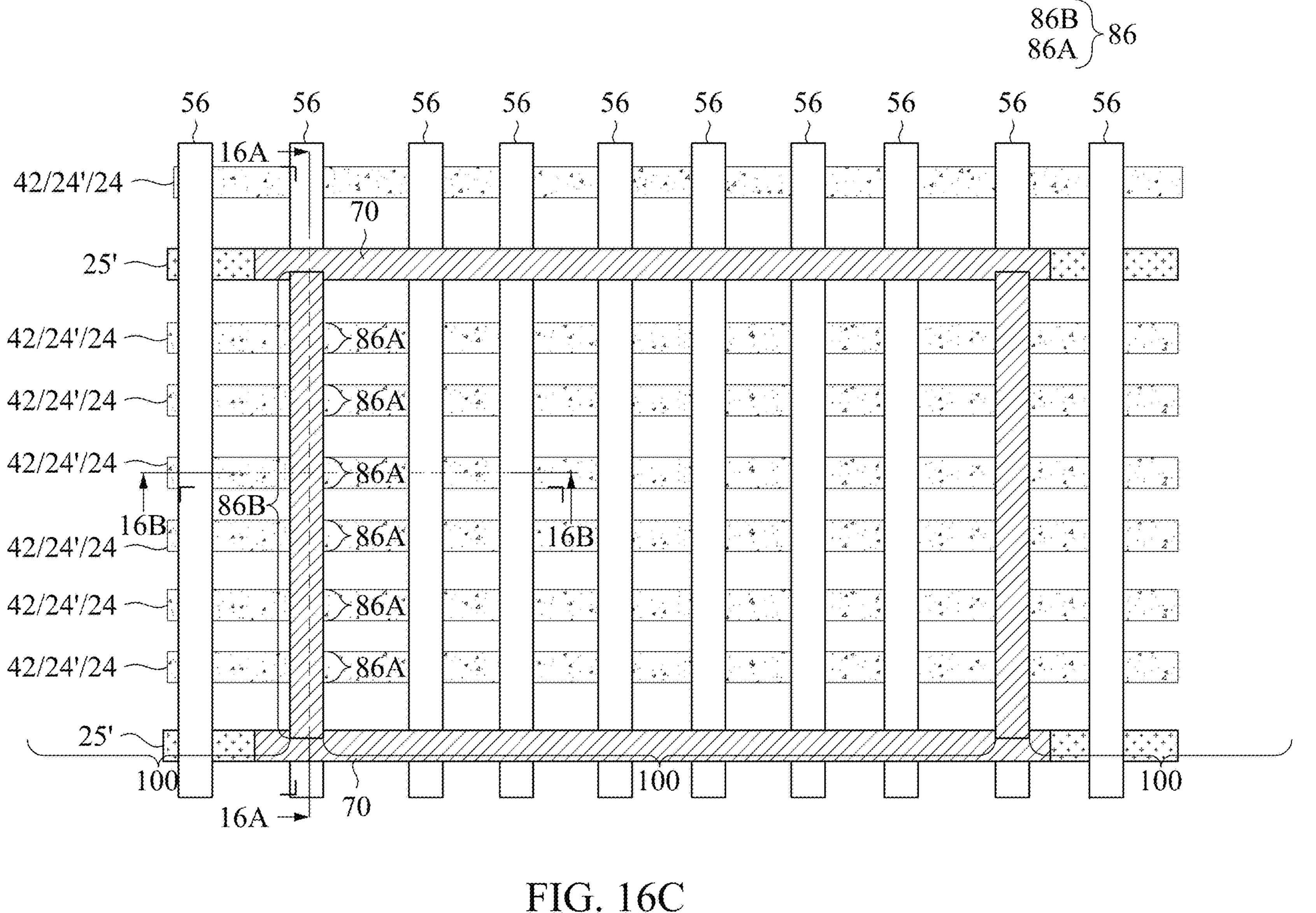

In subsequent processes, hard mask 64 is replaced with a dielectric material to form dielectric regions 90, as shown in FIGS. 16A and 16B. Next, some upper features are formed, which include etch stop layer 92, ILD 94, and gate contact plugs 96 Source/drain silicide regions (not shown) and source/drain contact plugs (not shown) are also formed on top of source/drain regions 42. The respective process is illustrated as process 232 in the process flow 200 as shown in FIG. 21. FinFETs 100 are thus formed.

FIG. 16C illustrates a top view of the structure shown in FIGS. 16A and 16B. FIG. 16A illustrates the cross-section 16A-16A in FIG. 16C, except that FIG. 16A illustrates two isolation regions 86A, while FIG. 16C illustrates six isolation regions 86A. FIG. 16B illustrates the cross-section 16B-16B in FIG. 16C. It is appreciated that FIG. 16C illustrates a simplified layout showing how fin isolation regions 86 and gate isolations 70 may cut fins and gate stacks, respectively. The actual layout of fin isolation regions 86 and gate isolations 70 may be different from, and may be more complicated than, what is illustrated.

Figure 17:
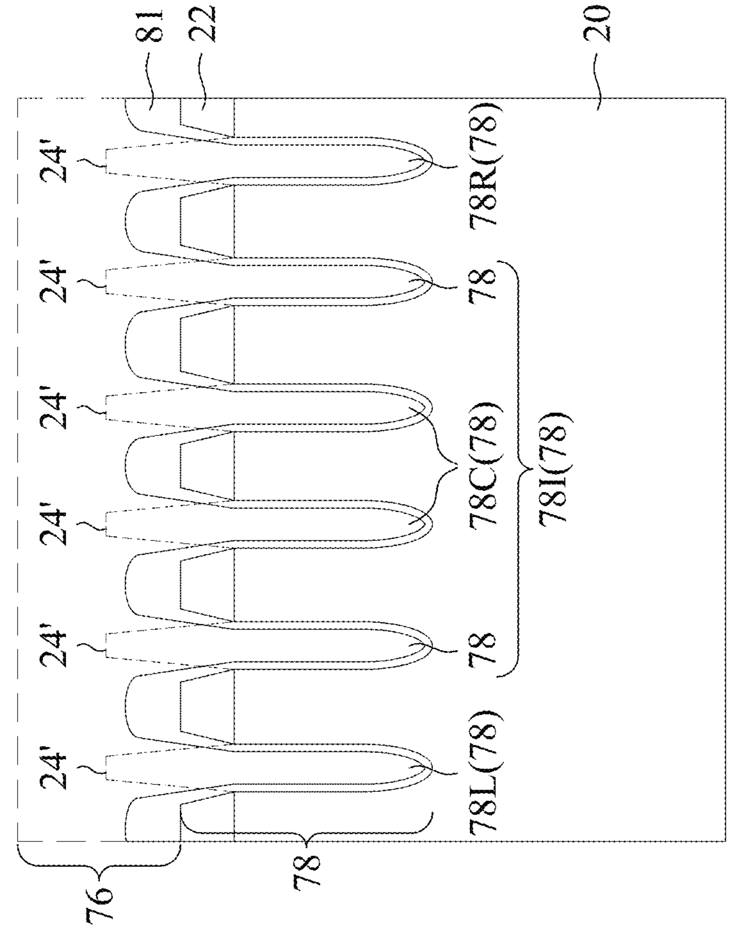
FIGS. 17-19 illustrate the magnified views of some portions of the cross-sectional views in the formation of fin isolation regions in accordance with some embodiments.
Figure 18:
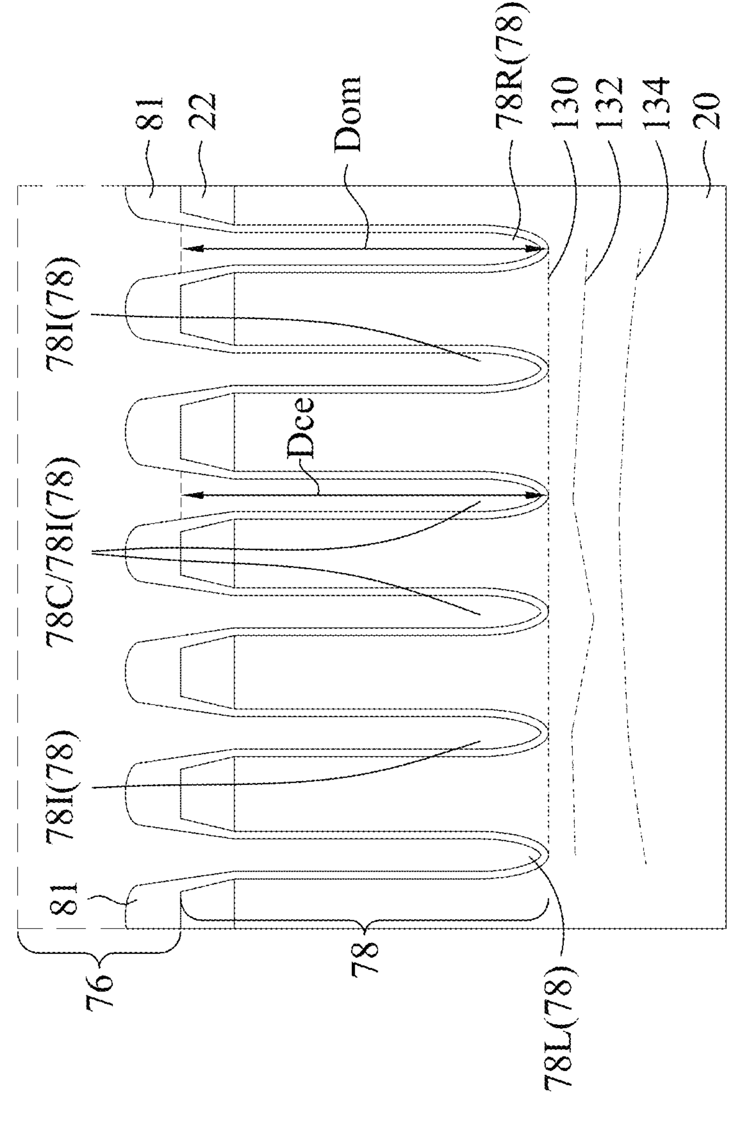

FIGS. 17 and 18 illustrate the magnified views of portion 80 in FIG. 13A in the etching of protruding semiconductor fins 24', semiconductor strips 24, and the underlying bulk portion of semiconductor substrate 20 to form trenches 76 and 78. In accordance with some embodiments, the etching process may be performed using HBr. $O_2$, and Ar as process gases. In accordance with alternative embodiments, other process gases such as Bromine ($Br_2$), $C_2F_6$, $CF_4$, $SO_2$, $CH_2F_2$, etc. may be used, or may be added into HBr, $O_2$, and Ar as process gases. HBr and $O_2$ (and possibly other gases when used) are used for etching chemically. Ar may be used as a carrier gas, and may also remove the semiconductor material mechanically through sputtering.

In the etching process, by-products 81 are generated. By-products 81 have the function of passivating and protecting the sidewalls of the bulk portion of semiconductor substrate 20, so that trenches 78 are more vertical. By-products 81, however, have some side-effects. By-products 81 cause the slow-down of the etching process. Furthermore, by-products 81 cause the pattern-loading in the etching process. For example, it has been found that in the regions where trenches 78 have a higher density, by-products 81 are thinner (due to the more spreading of by-products 81 to greater surface areas), and hence higher etching rates are resulted, wherein the etching rate is the increase in depth of trenches 78 per unit time. Conversely, in the regions where trenches 78 have a lower density, by-products 81 are thicker (due to the less spreading of by-products 81 to smaller surface areas), and hence lower etching rates are resulted. Furthermore, when trenches 78 are longer (in the top view), the etching rate is also higher.

It is appreciated that the sidewall portions of by-products 81 on the sidewalls of substrate 20 cannot be too thin. Otherwise, the protection from the by-products 81 is too low, and lateral etching may be severe. This may cause the epitaxy regions 42 (FIG. 13B) to be damaged. Accordingly, in accordance with embodiments of the present disclosure, by-products 81 are kept as having more uniform thicknesses throughout different trenches 78 to reduce the lateral etching.

Referring to FIG. 17, trenches 78 form a trench group have a uniform pitch, or a substantially uniform pitch, with the pitch variation smaller than, for example, 20 percent. The trench group includes a leftmost trench 78L and a rightmost trench 78R. Throughout the description, the trenches between the outmost trenches 78L and 78R are referred to as inner trenches 78I. The trench(es) in the middle of outmost trenches 78L and 78R are referred to as center trenches 78C, which are also inner trenches 78I. There is a single center trench 78C when the total count of trenches 78 is an odd number, and there are two center trenches 78C when the total count of trenches 78 is an even number.

The leftmost trench 78L and the rightmost trench 78R are in semi-dense regions because no trench is formed on one side of each of trenches 78L and 78R, while the other side has trenches. The inner trenches 78I are in higher trench-density regions than the outmost trenches 78L and 78R. As a result, in conventional applications, trenches were found to have deepest center trench(es), and shallowest outmost trenches. From the center trench(es) to the outmost trenches, the depths of the trenches reduced gradually in conventional applications. This caused the outmost trenches and the resulting isolation regions formed therein to have smallest depths. Since the isolation regions are used for blocking leakage currents, their ability of blocking leakage currents is adversely affected.

Figure 20:
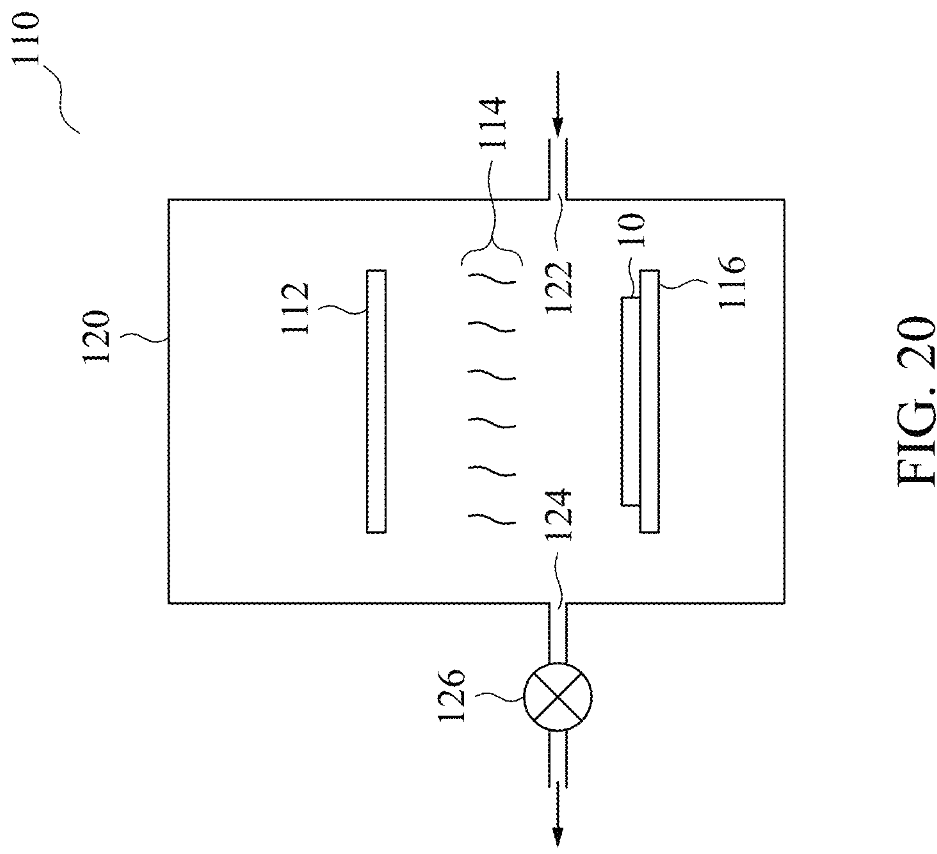
FIG. 20 schematically illustrates an etching tool used in the fin-cutting process in accordance with some embodiments.

In accordance with the embodiments of the present application, the etching tools and the etching process conditions are selected and adjusted to achieve deeper outmost trenches 78L and 78R (relative to the center trenches 78C). FIG. 20 illustrates a schematic view of etching tool 110 in accordance with some embodiments. Etching tool 110 has wafer 10 therein, and is configured to etch wafer 10 in order to form trenches 78. Etching tool 110 includes top electrode 112 and bottom electrode 116, with wafer 10 located in between. Plasma 114 is generated from the process gases therein in order to etch protruding semiconductor fins 24' (FIGS. 13A and 13B), semiconductor strips 24, and substrate 20.

Etching tool 110 includes chamber 120, and inlet 118, through which the process gases are conducted into chamber 120. The process gases are pumped out of chamber 120 through outlet 124, which is connected to pump 126. Experiments have revealed that increasing the gas conductance of chamber 120 may result in the increase in the depths of the outer trenches relative to the depth of inner trenches. The effect of gas conductance may be related to the improved efficiency in the removal of by-products 81 (FIGS. 17 and 18), and hence by-products 81 are thinner and have more uniform thickness in different trenches that have different depths, lengths, and densities.

A plurality of experiments have been performed to form trenches 78 on different wafers that have the same layout, with different conductance values used in the etching processes performed on different wafers. It has been found that with the increase in the gas conductance, the depth ratio Dom/Dce increases also, wherein Dom (FIG. 18) is the depth of the outmost trenches 78L and 78R, while Dce is the depth of the center trenches 78C. It has also been found that for the wafers etched using low gas conductance values, the corresponding depth ratios Dom/Dce of the trenches in the corresponding wafers are smaller than 1.0. When the gas conductance in etching a wafer equals to a threshold value, depth ratio Dom/Dce is increased to equal to 1.0. Further increasing the gas conductance, the depth ratios Dom/Dce of the corresponding wafers are further increased to be greater than 1.0. For example, depth ratio Dom/Dce of some wafers may be increased to a value greater than about 1.1, and may be in the range between about 1.0 and about 1.2.

In accordance with some embodiments, the threshold gas conductance (which is evaluated using flow rate/pressure ratio) corresponding to depth ratio Dom/Dce being equal to 1.0 is greater than about 20 sccm/mT, and may be in the range between about 15 sccm/mT and about 25 sccm/mT. Through the experiments, the desirable gas conductance that corresponds to the desirable profile of trenches (having the desirable Dom/Dce that is equal to or greater than 1.0) may be determined, and is used for the mass production of wafer 10.

It is appreciated that increasing the gas conductance also results in the reduction in the pressure in chamber 120. In accordance with some embodiments, the threshold chamber pressure in the etching process is about 30 mTorr when the threshold gas conductance is used. Accordingly, the chamber pressure in the etching process is lower than about 30 mTorr, and may be in the range between about 5 mTorr and about 30 mTorr.

To achieve the desirable gas conduction, the pumps of existing etching tools may be replaced with more powerful pumps. For example, pump 126 as shown in FIG. 20 may adopt a turbo pump. In accordance with some embodiments, with the increase in the gas conduction and the reduction in the chamber pressure, it is more difficult to generate plasma from etching gases. Accordingly, etching tool 110 may also adopt a mechanism that is more powerful in generating plasma. For example, Electron cyclotron Resonance (ECR) may be used to generate plasma, rather than Inductively Coupled Plasma (ICP).

In addition to gas conductance, other process conditions may also be adjusted to achieve higher depth ratios Dom/Dce. For example, the sputtering effect may also be increased to achieve more uniform depths of trenches 78. In accordance with some embodiments, in the etching process, bias power is provided to increase the sputtering effect. The bias power may be turned on and off in cycles, and there may be a plurality of off-on cycles in the formation of trenches. For example, in an off-period of an off-on cycle, no bias power is provided for a first period of time T1. The sputtering effect is low during this period of time. In an on period of the off-on cycle, bias power is provided for a second period of time T2, so that the sputtering effect is high. During the off-on cycle, etching gases HBr, $O_2$, and Ar etc. may be conducted continuously. To increase the sputtering effect, off/on ratio T2/T1 is increased, so that depth ratios Dom/Dce are closer to 1.0.

It is realized that off/on ratio T2/T1 cannot be too high and cannot be too Low. When off/on ratio T2/T1 is too low, the effect of improving depth uniformity through sputtering effect is low. When off/on ratio T2/T1 is too high, the bowing effect, which means that the middle portion of trenches 78 immediately underlying STI regions 22 are wider than the overlying portions and underlying portions, is adversely increased. In accordance with some embodiments, off/on ratio T2/T1 may be in the range between about 0.25 and about 4.

The sputtering effect may also be increased by increasing the bias power. Again, the bias power cannot be too low or too high. Otherwise, either the sputtering effect is too low or the bowing is too severe. In accordance with some embodiments, the bias power may be in the range between about 20 watts and about 700 watts.

As shown in FIGS. 17 and 18, with the proceeding of the etching of semiconductor substrate 20, the depths of trenches 78 further increase, until desirable depths are reached, and FIG. 18 illustrates the trenches 78 when the etching process is finished. For example, the depths of trenches 78 may be in the range between about 130 nm and about 170 nm when the etching process is finished.

It is also realized that the etching of semiconductor of different portions may be adjusted to have adjusted process conditions. For example, in the initial stage of the etching such as the etching of protruding semiconductor fins 24' and semiconductor strips 24, the trenches are wider, the non-uniformity in the thicknesses of by-products 81 is also not significant. Accordingly, the etching of protruding semiconductor fins 24' and semiconductor strips 24 may be performed using a first process condition. The subsequent etching of the bulk portion of semiconductor substrate 20, however, suffers more from the thickness non-uniformity of by-products 81. Accordingly, etching process conditions need to be carefully controlled to improve the thickness uniformity of by-products 81, and a second process condition different from the first process condition may be used to etch the bulk portion of semiconductor substrate 20.

In accordance with some embodiments, the first process condition includes a first off/on ratio T2/T1, a first bias power, a first gas conductance value, and a first chamber pressure. The second process condition includes a second off/on ratio T2/T1, a second bias power, a second gas conductance value, and a second chamber pressure. In accordance with some embodiments, the second off/on ratio T2/T1 is greater than the first T2/T1 ratio, and/or the second bias power is greater than the first bias power. The first gas conductance value may be smaller than the second gas conductance value. The first chamber pressure may be higher than the second chamber pressure.

FIG. 18 illustrates the profiles of the bottoms of trenches 78 in accordance with some embodiments. The outmost trenches 78L and 78R have the depths Dom equal to or greater than the depth of at least one inner trench. The bottoms of trenches 78 may be aligned to a horizontal straight line 130 in accordance with some embodiments. In accordance with alternative embodiments, the bottoms of trenches 78 may also be aligned to the straight line 130 substantially, for example, with the greatest average depth difference among trenches 78 being smaller than about 5 nm. In accordance with yet alternative embodiments, as represented by dashed line 132, from the outmost trench 78R to the center trench 78C, the bottoms of some trenches 78 are aligned to a straight and slant straight line. There may also be some variations, with one of the outmost trenches 78L and 78R being deeper than a first inner trench 78 78I, but shallower than a second inner trench 78I. Dashed line 134 illustrates another profile, wherein the outmost trenches 78L and 78R are the deepest, and the center trench (es) 78C are the shallowest. From the outmost trenches 78L and 78R to the center trenches 78C, the depths of trenches 78 may reduce gradually.

Figure 19:
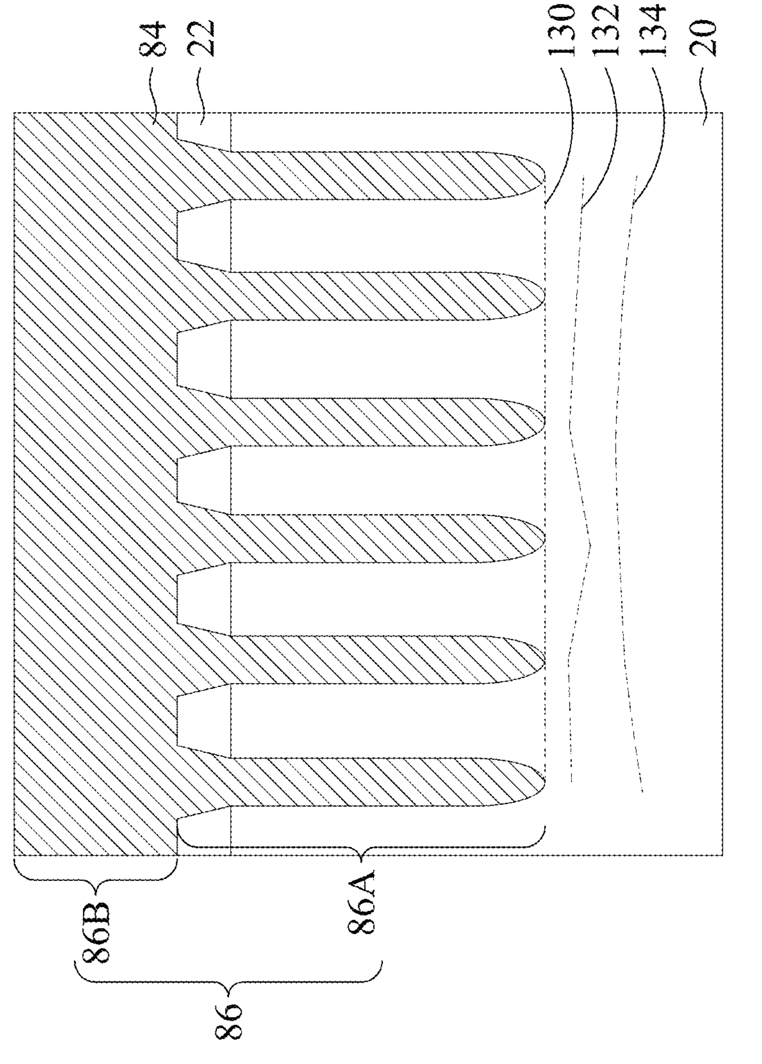

FIG. 19 illustrates a magnified view of a portion 80' in FIG. 16A, wherein the isolation regions 86 have a total count greater than two. Similarly, dashed lines 130, 132, and 134 are drawn to show different possible profiles of bottoms of isolation regions 86. Isolation region 86 include upper portion 86B and lower portions 86A. Lower portions 86A include outmost parts 86AL and 86AR, inner parts 86AI, and center part(s) 86AC, which fill outmost parts 78L and 78R, inner parts 78I, and center part(s) 78C, respectively.

The embodiments of the present disclosure have some advantageous features. By selecting the etching tool and process conditions for etching semiconductor fins and the underlying bulk portions of semiconductor substrate, fin isolation regions (for cutting semiconductor fins) may have deeper outmost isolation regions, thus improving their ability of blocking leakage current.

In accordance with some embodiments, a method comprises forming a gate stack on a semiconductor region, wherein the semiconductor region is over a bulk semiconductor substrate; etching the gate stack to form a first trench, wherein a plurality of protruding semiconductor fins are revealed to the first trench; etching the plurality of protruding semiconductor fins to form a plurality of second trenches extending into the bulk semiconductor substrate, wherein the plurality of second trenches are underlying and joined to the first trench, and wherein the plurality of second trenches comprise a first outmost trench having a first depth; a second outmost trench; and an inner trench between the first outmost trench and the second outmost trench, wherein the inner trench has a second depth equal to or smaller than the first depth; and forming a fin isolation region filling the first trench and the plurality of second trenches.

In an embodiment, the structure further comprises, before the etching the gate stack to form the plurality of second trenches, etching the gate stack to form a third trench, wherein a dummy fin is underlying and exposed to the third trench; and forming a gate isolation region filling the third trench. In an embodiment, in the etching the plurality of protruding semiconductor fins, a pressure of a respective etching chamber is lower than about 30 mTorr. In an embodiment, in the etching the plurality of protruding semiconductor fins, a plasma is generated from a respective etching gas using ECR. In an embodiment, the second depth is equal to the first depth. In an embodiment, the second depth is smaller than the first depth.

In an embodiment, the etching the gate stack to form the first trench comprises forming a hard mask layer, wherein both of the first trench and the plurality of second trenches are formed using the hard mask layer as parts of an etching mask. In an embodiment, the hard mask layer comprises amorphous silicon. In an embodiment, the plurality of second trenches comprise a plurality of inner trenches between the first outmost trench and the second outmost trench, and wherein the first outmost trench and the second outmost trench are deeper than all inner trenches in the plurality of inner trenches. In an embodiment, the plurality of inner trenches comprise a center trench in middle between the first outmost trench and the second outmost trench, and wherein trenches from the center trench to the first outmost trench have increasingly greater depths.

In accordance with some embodiments, a structure comprises a semiconductor region; a gate stack on the semiconductor region, wherein the gate stack comprises a first gate stack portion and a second gate stack portion; and a fin isolation region separating the first gate stack portion from the second gate stack portion, wherein the fin isolation region comprises a first part higher than a bottom surface of the gate stack; and a plurality of second parts underlying and joined to the first part, wherein a first outmost part in the plurality of second parts has a first depth equal to or greater than a second depth of an inner part in the plurality of second parts. In an embodiment, the first depth is equal to the second depth.

In an embodiment, the first depth is greater than the second depth. In an embodiment, the plurality of second parts further comprise a second outmost part; and a center part in middle between the first outmost part and the second outmost part, wherein from the center part to the first outmost part, heights of the plurality of second parts increase gradually. In an embodiment, the structure further comprises a gate isolation region penetrating through the gate stack, wherein the fin isolation region contacts the gate isolation region. In an embodiment, the fin isolation region extends into the gate isolation region.

In accordance with some embodiments, a structure comprises a semiconductor substrate; dielectric isolation regions extending into the semiconductor substrate; a plurality of semiconductor fins protruding higher than the dielectric isolation regions and parallel to each other; a gate stack over the plurality of semiconductor fins; a plurality of source/drain regions extending into the plurality of semiconductor fins; and a dielectric isolation region contacting sidewalls of the plurality of semiconductor fins, wherein the gate stack and the dielectric isolation region are on opposite sides of the plurality of source/drain regions, wherein the dielectric isolation region comprises an upper part; and a plurality of lower parts underlying and joined to the upper part, wherein outer parts in the plurality of lower parts are deeper than inner parts in the plurality of lower parts. In an embodiment, an outmost part in the plurality of lower parts is deepest among the plurality of lower parts. In an embodiment, a center part in the plurality of lower parts is shallowest among the plurality of lower parts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a gate stack on a semiconductor region, wherein the semiconductor region is over a bulk semiconductor substrate;

etching the gate stack to form a first trench, wherein a plurality of protruding semiconductor fins are revealed to the first trench;

etching the plurality of protruding semiconductor fins to form a plurality of second trenches extending into the bulk semiconductor substrate, wherein the plurality of second trenches are underlying and joined to the first trench, and wherein the plurality of second trenches comprise:

a first outmost trench having a first depth;

a second outmost trench; and an inner trench between the first outmost trench and the second outmost trench, wherein the inner trench has a second depth equal to or smaller than the first depth, wherein the inner trench extends to a position that is underlying a respective one of the plurality of protruding semiconductor fins that has been etched; and forming a fin isolation region filling the first trench and the plurality of second trenches.

2. The method of claim 1 further comprising:

before the etching the gate stack to form the plurality of second trenches, etching the gate stack to form a third trench, wherein a dummy fin is underlying and exposed to the third trench; and forming a gate isolation region filling the third trench.

3. The method of claim 1, wherein in the etching the plurality of protruding semiconductor fins, a gas conductance in a respective etching chamber is higher than about 20 sccm/mT.

4. The method of claim 1, wherein in the etching the plurality of protruding semiconductor fins, a pressure of a respective etching chamber is lower than about 30 mTorr.

5. The method of claim 1, wherein in the etching the plurality of protruding semiconductor fins, a plasma is generated from a respective etching gas using Electron cyclotron Resonance (ECR).

6. The method of claim 1, wherein the second depth is equal to the first depth.

7. The method of claim 1, wherein the second depth is smaller than the first depth.

8. The method of claim 1, wherein the etching the gate stack to form the first trench comprises:

forming a hard mask layer, wherein both of the first trench and the plurality of second trenches are formed using the hard mask layer as parts of an etching mask.

9. The method of claim 8, wherein the hard mask layer comprises amorphous silicon.

10. The method of claim 1, wherein the plurality of second trenches comprise a plurality of inner trenches between the first outmost trench and the second outmost trench, with the inner trench being one of the plurality of inner trenches, and wherein the first outmost trench and the second outmost trench are deeper than all inner trenches in the plurality of inner trenches.

11. The method of claim 10, wherein the plurality of inner trenches comprise a center trench in middle between the first outmost trench and the second outmost trench, and wherein trenches from the center trench to the first outmost trench have increasingly greater depths.

12. A method comprising:

forming a plurality of shallow trench isolation regions in a semiconductor substrate, wherein the plurality of shallow trench isolation regions are over a bulk substrate of the semiconductor substrate;

forming a gate stack on a semiconductor region, wherein the semiconductor region is laterally between two of the plurality of shallow trench isolation regions, and wherein the gate stack comprises a first gate stack portion and a second gate stack portion; and forming a fin isolation region, wherein the fin isolation region is between the first gate stack portion and the second gate stack portion, and wherein the fin isolation region comprises:

a first part higher than a bottom surface of the gate stack; and a plurality of second parts underlying and joined to the first part, wherein a first outmost part in the plurality of second parts has a first depth equal to or greater than a second depth of an inner part in the plurality of second parts, and wherein neighboring ones of the plurality of second parts interface with opposing sidewalls of corresponding ones of the plurality of shallow trench isolation regions.

13. The method of claim 12, wherein the first depth is equal to the second depth.

14. The method of claim 12, wherein the first depth is greater than the second depth.

15. The method of claim 12, wherein the plurality of second parts further comprise:

a second outmost part; and a center part in middle between the first outmost part and the second outmost part, wherein from the center part to the first outmost part, heights of the plurality of second parts increase gradually.

16. The method of claim 12 further comprising forming a gate isolation region penetrating through the gate stack, wherein the fin isolation region contacts the gate isolation region.

17. The method of claim 16, wherein a portion of the fin isolation region is in a second portion of the gate isolation region.

18. A method comprising:

forming dielectric isolation regions, wherein the dielectric isolation regions comprise parts in a semiconductor substrate;

forming a plurality of semiconductor fins protruding higher than the dielectric isolation regions and parallel to each other;

forming a gate stack over the plurality of semiconductor fins;

forming a plurality of source/drain regions extending into the plurality of semiconductor fins; and forming a fin isolation region contacting sidewalls of the plurality of semiconductor fins, wherein the gate stack and the fin isolation region are on opposite sides of the plurality of source/drain regions, wherein the fin isolation region comprises:

an upper part; and a plurality of lower parts underlying and joined to the upper part, wherein outer parts in the plurality of lower parts are deeper than inner parts in the plurality of lower parts, and wherein in a cross-sectional view of the fin isolation region, neighboring ones of the plurality of lower parts are separated from each other by corresponding ones of the dielectric isolation regions.

19. The method of claim 18, wherein an outmost part in the plurality of lower parts is deepest among the plurality of lower parts.

20. The method of claim 19, wherein a center part in the plurality of lower parts is shallowest among the plurality of lower parts.

* * * * *